(12) United States Patent
Kuwazawa

(10) Patent No.: US 7,141,848 B1
(45) Date of Patent: Nov. 28, 2006

(54) MEMORY DEVICE AND DISSIMILAR CAPACITORS FORMED ON SAME SUBSTRATE

(75) Inventor: Kazunobu Kuwazawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/544,392

(22) Filed: Apr. 6, 2000

(30) Foreign Application Priority Data

| Apr. 6, 1999 | (JP) | ................................. 11-099033 |
| Apr. 4, 2000 | (JP) | ............................. 2000-102083 |

(51) Int. Cl.
*H01L 29/788* (2006.01)

(52) U.S. Cl. ...................... 257/316; 257/296; 257/324; 257/532; 257/640; 438/257; 438/238; 438/585

(58) Field of Classification Search ................ 257/296, 257/316, 324, 532, 640; 438/257–267, 238, 438/585
See application file for complete search history.

(56) References Cited

U.S. PATENT DOCUMENTS 5,886,377 A * 3/1999 Tsuruta et al. .............. 257/315

FOREIGN PATENT DOCUMENTS

| JP | 03-105981 | 5/1991 |
| JP | 04-348568 | 12/1992 |
| JP | 05-021808 | 1/1993 |
| JP | 09-092736 | 4/1997 |
| JP | 09-321227 | 12/1997 |
| JP | 10-154792 | 6/1998 |

* cited by examiner

*Primary Examiner*—Nathan J. Flynn
*Assistant Examiner*—Scott Wilson
(74) *Attorney, Agent, or Firm*—Hogan & Hartson, L.L.P.

(57) ABSTRACT

A semiconductor device has a split-gate type memory transistor, a capacitor element, and another capacitor element formed on the same chip, in which the capacitor values of the capacitor element and the another capacitor element are independently set to different values. A capacitor element 53 has a dielectric film that includes a silicon oxide film 41 (thermal oxide film), a silicon nitride film 43b and a silicon oxide film 57 (thermal oxide film). A capacitor element 55 has a dielectric film that includes a silicon oxide film 25 (thermal oxide film), a silicon oxide film 37 (CVD silicon oxide film), a silicon oxide film 41 (thermal oxide film), a silicon nitride film 43b and a silicon oxide film 57 (thermal oxide film).

33 Claims, 24 Drawing Sheets

MEMORY DEVICE AND DISSIMILAR CAPACITORS FORMED ON SAME SUBSTRATE

BACKGROUND OF THE INVENTION

1. Field of the Invention

The present invention relates to a semiconductor device including a non-volatile memory transistor and a method for manufacturing the same.

2. Description of Related Art

In recent years, the mixed-mounting of various types of circuits is required in consideration of various factors, such as, for example, to shorten the chip interface delay, to reduce the cost per board area, and to reduce the cost in design and development of boards.

SUMMARY OF THE INVENTION

It is an object of the present invention to provide a semiconductor device having a non-volatile memory transistor and another device element that are mounted on the same semiconductor substrate, and a method for manufacturing the same.

[1] In accordance with the present invention, a semiconductor device having a non-volatile memory transistor comprises a capacitor element and another capacitor element, wherein the non-volatile memory transistor, the capacitor element and the another capacitor element are formed in one semiconductor substrate; the capacitor element includes a lower electrode, a dielectric film and an upper electrode; the another capacitor element has another lower electrode, another dielectric film and another upper electrode; and the another dielectric film has a film thickness that is different from a film thickness of the dielectric film.

In the semiconductor device of the present invention, the film thickness of the another dielectric film is different from the film thickness of the dielectric film. As a result, capacitor values of the capacitor element and the another capacitor element can be set to any specified values. It is noted that the non-volatile memory transistor refers to a flush-cell, for example. Non-volatile memory transistors to be described below may be understood in the same manner.

In accordance with the present invention, a semiconductor device having a non-volatile memory transistor comprises a capacitor element and another capacitor element, wherein the non-volatile memory transistor, the capacitor element and the another capacitor element are formed in one semiconductor substrate; the capacitor element includes a lower electrode, a dielectric film having a plurality of films as components and an upper electrode; the another capacitor element having another lower electrode, another dielectric film having a plurality of films as component elements and another upper electrode; and the components of the another dielectric film being different from the components of the dielectric films.

In the semiconductor device of the present invention, the another dielectric film has components that are different from components of the dielectric film. As a result, the capacitor values of the capacitor element and the another capacitor element can be set at any desired values.

In accordance with other embodiments of the present invention, the semiconductor device may have the following aspects.

(1) Each of the dielectric film and the another dielectric film has an ONO film. The ONO film is a film having an oxide film, a nitride film and an oxide film laid one on top of the other.

The oxide film is an insulation film that contains oxygen, such as, for example, a silicon oxide film. The nitride film is an insulation film that includes nitrogen, such as, for example, silicon nitride film. ONO films, oxide films and nitride films to be described below may be understood in the same manner.

(2) The dielectric film has a structure including a thermal oxidation film, a nitride film and an oxide film successively laid in a direction from the lower electrode toward the upper electrode, and the another dielectric film has a structure including a first thermal oxide film, a CVD oxide film, a second thermal oxide film, a nitride film and an oxide film successively laid in a direction from the another lower electrode toward the another upper electrode.

The dielectric film may have a three-layered structure as described above, or may further include additional films. The another dielectric film may have a five-layered structure as described above, or may further include other additional films.

(3) The dielectric film may have a structure including only a thermal oxidation film, a nitride film and an oxide film successively laid in a direction from the lower electrode toward the upper electrode, and the another dielectric film may have a structure including only a first thermal oxide film, a CVD oxide film, a second thermal oxide film, a nitride film and an oxide film successively laid in a direction from the another lower electrode toward the another upper electrode.

The dielectric film is composed of only the three layers described above. No additional film is added. The another dielectric film is composed on only the five layers described above. No other films are added.

(4) The thermal oxide film of the dielectric film and the second thermal oxide film of the another dielectric film are films that are formed in the same step, the nitride film of the dielectric film and the nitride film of the another dielectric film are films that are formed in the same step, and the oxide film of the dielectric film and the oxide film of the another dielectric film are films that are formed in the same step.

As a result, the process for manufacturing the semiconductor device is simplified.

(5) The CVD oxide film of the another dielectric film includes a high-temperature CVD oxide film.

As a result, the CVD oxide film becomes a dense film, and therefore, the dielectric strength of the another capacitor element is improved.

(6) Each of the oxide film of the dielectric film and the oxide film of the another dielectric film includes a thermal oxide film.

As a result, when field effect transistors are mixed and mounted on the same semiconductor substrate, gate oxide films can be formed at the same time when the oxide films are formed.

(7) The thermal oxide film of the dielectric film has a thickness grown by a method that grows a thermal oxide film on silicon to a thickness of 30–200 angstrom.

The nitride film of the dielectric film has a thickness of 50–500 angstrom.

The oxide film of the dielectric film has a thickness grown by a method that grows a thermal oxide film on silicon to a thickness of 60–80 angstrom.

The first thermal oxide film of the another dielectric film has a thickness grown by a method that grows a thermal oxide film on silicon to a thickness of 60–80 angstrom.

The CVD oxide film of the another dielectric film has a thickness of 100–200 angstrom (most preferably, 150 angstrom).

The second thermal oxide film of the another dielectric film has a thickness grown by a method that grows a thermal oxide film on silicon to a thickness of 30–200 angstrom.

The nitride film of the another dielectric film has a thickness of 50–500 angstrom.

The oxide film of the another dielectric film has a thickness grown by a method that grows a thermal oxide film on silicon to a thickness of 60–80 angstrom.

(8) Each of the oxide film of the dielectric film and the oxide film of the another dielectric film includes a CVD oxide film.

As a result, in particular, when field effect transistors having a high dielectric strength are mixed and mounted on the same semiconductor substrate, the oxide films can be used as parts of the gate oxide films.

(9) The thermal oxide film of the dielectric film has a thickness grown by a method that grows a thermal oxide film on silicon to a thickness of 30–200 angstrom, the nitride film of the dielectric film has a thickness of 50–500 angstrom, the oxide film of the dielectric film has a thickness of 100–200 angstrom, the first thermal oxide film of the another dielectric film has a thickness grown by a method that grows a thermal oxide film on silicon to a thickness of 60–80 angstrom, the CVD oxide film of the another dielectric film has a thickness of 100–200 angstrom, the second thermal oxide film of the another dielectric film has a thickness grown by a method that grows a thermal oxide film on silicon to a thickness of 30–200 angstrom, the nitride film of the another dielectric film has a thickness of 50–500 angstrom, and the oxide film of the another dielectric film has a thickness of 100–200 angstrom.

(10) The upper electrode and the another upper electrode are electrodes that are formed from polysilicon.

(11) The upper electrode and the another upper electrode are electrodes that may be formed from polycide.

As a result, the upper electrode and the another upper electrode can be made to have a low resistance, such that the semiconductor device can achieve a higher speed.

(12) The upper electrode and the another upper electrode are electrodes that may be formed from metal.

As a result, the upper electrode and the another upper electrode can be made to have a low resistance, such that the semiconductor device can achieved a higher speed.

(13) The upper electrode and the another upper electrode are electrodes that may be formed from salicide.

As a result, the upper electrode and the another upper electrode can be made to have a low resistance, such that the semiconductor device can achieve a higher speed.

(14) The lower electrode and the another lower electrode are films that are formed in the same step, and the upper electrode and the another upper electrode are films that are formed in the same step.

As a result, the process for manufacturing the semiconductor device is simplified.

(15) The non-volatile memory transistor includes a floating gate, a control gate, and an intermediate insulation film located between the floating gate and the control gate, wherein the intermediate insulation film has a structure having a first thermal oxide film, a CVD oxide film, a second thermal oxide film and an oxide film that are successively disposed in a direction from the floating gate toward the control gate.

The intermediate insulation film refers to a film that functions as a tunneling insulation film, for example, when the non-volatile memory transistor operates.

(16) The first thermal oxide film of the intermediate insulation film and the first thermal oxide film of the another dielectric film are films that are formed in the same step.

The CVD oxide film of the intermediate insulation film and the CVD oxide film of the another dielectric film are films that are formed in the same step.

The second thermal oxide film of the intermediate insulation film, the thermal oxide film of the dielectric film and the second thermal oxide film of the another dielectric film are films that are formed in the same step.

The oxide film of the intermediate insulation film, the oxide film of the dielectric film and the oxide film of the another dielectric film are films that are formed in the same step.

As a result, the process for manufacturing the semiconductor device can be simplified.

(17) The intermediate insulation film includes a nitride film. The nitride film of the intermediate insulation film is located below a sidewall of the floating gate and between the second thermal oxide film of the intermediate insulation film and the oxide film of the intermediate insulation film.

When a voltage (for example, a negative voltage) is applied to the control gate for operating the non-volatile memory transistor, the electric field may concentrate in the sidewall lower section of the floating gate. By the structure described above, the dielectric strength of the intermediate insulation film can be improved.

(18) The nitride film of the intermediate insulation film, the nitride film of the dielectric film and the nitride film of the another dielectric film are films that are formed in the same step.

As a result, the process for manufacturing the semiconductor device can be simplified.

(19) The CVD oxide film of the intermediate insulation film includes a high-temperature thermal CVD oxide film.

As a result, the CVD oxide film becomes dense, and therefore the dielectric strength of the intermediate insulation film can be improved.

(20) The oxide film of the intermediate insulation film includes at least one of a thermal oxide film and a CVD oxide film.

(21) The control gate, the upper electrode and the another upper electrode are electrodes that are formed from polysilicon.

(22) The control gate, the upper electrode and the another upper electrode are electrodes that are formed from polycide.

As a result, the control gate, the upper electrode and the another upper electrode can be made to have a low resistance, and therefore the operation speed of the semiconductor device can be improved.

(23) The control gate, the upper electrode and the another upper electrode are electrodes that are formed from metal.

As a result, the control gate, the upper electrode and the another upper electrode can be made to have a low resistance, and therefore the operation speed of the semiconductor device can be improved.

(24) The control gate, the upper electrode and the another upper electrode are electrodes that are formed from salicide.

As a result, the control gate, the upper electrode and the another upper electrode can be made to have a low resistance, and therefore the operation speed of the semiconductor device can be improved.

(25) The floating gate, the lower electrode and the another lower electrode are films that are formed in the same step, and the control gate, the upper electrode and the another upper electrode are films that are formed in the same step.

As a result, the process for manufacturing the semiconductor device can be simplified.

(26) An area of the upper electrode that faces a surface of the dielectric film is the same as an area of the another upper electrode that faces a surface of the another dielectric film.

In the present invention, the dielectric film and the another dielectric film have different film thickness (components are different). As a result of the structure described above, the capacitor element and the another capacitor element can be made to have different capacitor values.

(27) An area of the upper electrode that faces a surface of the dielectric film may be different from an area of the another upper electrode that faces a surface of the another dielectric film.

In the present invention, the dielectric film and the another dielectric film have different film thickness (components are different). As a result of the structure described above, the capacitor element and the another capacitor element can be made to have the same capacitor value.

(28) The another lower electrode has an impurity concentration different from an impurity concentration of the lower electrode.

The capacitor value can be controlled by changing the impurity concentration. Therefore, in accordance with the embodiment described above, a range of combinations of the capacitance value of a capacitor element and the capacitance value of another capacitor element can be broadened.

(29) The dielectric film has a film thickness of 180–900 angstrom, and the another dielectric film has a film thickness of 340–1180 angstrom.

(30) The capacitor element has a capacitor value that is different from a capacitor value of the another capacitor element.

(31) The capacitor element and the another capacitor element are components of an analogue circuit.

(32) The non-volatile memory transistor includes a split-gate type non-volatile memory transistor.

[2] The present invention provides a method for manufacturing a semiconductor device having a structure that includes a non-volatile memory transistor, a capacitor element and another capacitor element formed in one semiconductor substrate, wherein the non-volatile memory transistor includes a floating gate, an intermediate insulation film and a control gate, the capacitor element includes a lower electrode, a dielectric film and an upper electrode, and the another capacitor element has another lower electrode, another dielectric film and another upper electrode. The method comprises the steps of:

(a) forming the floating gate, the lower electrode and the another lower electrode on the semiconductor substrate;
(b) forming a first oxide film on the floating gate, the lower electrode and the another lower electrode;
(c) forming a second oxide film on the first oxide film;
(d) patterning the first oxide film and the second oxide film to thereby leave the first oxide film and the second oxide film that become components of the intermediate insulation film on sidewalls on the floating gate, to remove the first oxide film and the second oxide film on the lower electrode, and to leave the first oxide film and the second oxide film that become components of the another dielectric film on the another lower electrode;
(e) forming a third oxide film that becomes a component of the intermediate insulation film, a component of the dielectric film and a component of the another dielectric film on the second oxide film on the sidewall of the floating gate, the lower electrode and the second oxide film on the another lower electrode, respectively,
(f) forming a nitride film that becomes a component of the dielectric film and a component of the another dielectric film on the third oxide film on the lower electrode and the third oxide film on the another lower electrode, respectively,
(g) forming a fourth oxide film that becomes a component of the intermediate insulation film, a component of the dielectric film and a component of the another dielectric film on the third oxide film on the sidewall of the floating gate, the nitride film on the lower electrode and the nitride film on the another lower electrode, respectively, and
(h) forming, after the step (g), the control gate, the upper electrode and the another upper electrode on the semiconductor substrate.

In the method for manufacturing the semiconductor device in accordance with the present invention, a non-volatile memory transistor, a capacitor element and another capacitor element can be formed on one semiconductor substrate. Both of the dielectric film of the capacitor element and the dielectric film of the another capacitor element are ONO films. Furthermore, the film thickness of the another dielectric film can be made different from that of the dielectric film. (In other words, the another dielectric film can include a component that is different from a component of the dielectric film.)

The semiconductor device in accordance with the present invention can be provided with the following embodiments.

(1) The step (a) includes the step of introducing an impurity in the lower electrode to make the lower electrode to have a first impurity concentration, and the step of introducing an impurity in the another lower electrode to make the another lower electrode to have a second impurity concentration that is different from the first impurity concentration.

The capacitor value can be controlled by changing the impurity concentration. Accordingly, a range of combinations of capacitor values of a capacitor element and another capacitor element can be broadened. It is noted that the term "introducing an impurity" may refer to implantation of ions or diffusion of ions.

(2) The first oxide film is formed by thermal oxidation.
(3) The second oxide film is formed by CVD.
(4) The CVD includes a high-temperature CVD.
(5) The third oxide film is formed by thermal oxidation.
(6) The nitride film is formed by CVD.
(7) The fourth oxide film is formed by thermal oxidation.

(8) The fourth oxide film is formed by CVD.

(9) The step (f) includes the steps of:

forming a nitride film on the third oxide film;

forming a mask film on the nitride film on the third oxide film over the lower electrode and on the nitride film on the third oxide film over the another lower electrode;

selectively removing the nitride film by anisotropic etching, using the mask film as a mask to leave the nitride film that becomes a component of the intermediate insulation film, a component of the dielectric film and a component of the another dielectric film on the third oxide film on a sidewall lower section of the floating gate, on the third oxide film on the lower electrode and on the third oxide film on the another lower electrode, respectively.

Accordingly, the nitride film that becomes a component of the intermediate insulation film, a component of the dielectric film and a component of the another dielectric film can be formed at the same time.

(10) The step (a) includes the step of forming a selective oxide film on the floating gate.

(11) The step of forming the selective oxide film includes the steps of forming a conductive film on the semiconductor substrate, and forming the selective oxide film on the conductive film that becomes the floating gate.

(12) The floating gate is patterned, using the selective oxide film as a mask.

(13) The step (a) includes the steps of forming a conductive film on the semiconductor substrate, and patterning the conductive film to form the floating gate, the lower electrode and the another lower electrode at the same time.

As a result, the process for manufacturing the semiconductor device is simplified.

(14) The step (h) includes the steps of forming another conductive film on the semiconductor substrate, and patterning the another conductive film to form the control gate, the upper electrode and the another upper electrode at the same time.

As a result, the process for manufacturing the semiconductor device is simplified.

(15) The non-volatile memory transistor includes a split-gate type non-volatile memory transistor.

[3] The present invention provides a semiconductor device having a non-volatile memory transistor. The semiconductor device comprises a capacitor element, wherein the non-volatile memory transistor and the capacitor element are formed in one semiconductor substrate. The capacitor element includes a lower electrode, a dielectric film and an upper electrode. The dielectric film has a structure that includes a first oxide film, a second oxide film, a nitride film and a third oxide film successively laid in a direction from the lower electrode toward the upper electrode.

The present invention can provide a semiconductor device in which the non-volatile memory transistor and the capacitor element having the four-layered structure described above are formed on the single semiconductor substrate. The dielectric film may have the four-layered structure described above, or may further include additional films.

The present invention provides a semiconductor device having a non-volatile memory transistor. The semiconductor device comprises a capacitor element, wherein the non-volatile memory transistor and the capacitor element are formed in one semiconductor substrate. The capacitor element includes a lower electrode, a dielectric film and an upper electrode, and the dielectric film has a structure that includes only a first oxide film, a second oxide film, a nitride film and a third oxide film successively laid in a direction from the lower electrode toward the upper electrode.

The present invention can provide a semiconductor device in which the non-volatile memory transistor and the capacitor element having the four-layered structure described above are formed on the single semiconductor substrate. The dielectric film has only the four layers, and does not have an additional film.

The semiconductor device of the present invention may be provided with the following embodiments.

(1) The first oxide film includes a thermal oxide film, the second oxide film includes a CVD oxide film and the third oxide film includes a thermal oxide film.

(2) The second oxide film includes a high-temperature CVD oxide film.

As a result, the second oxide film becomes a dense film, and therefore the dielectric strength of the capacitor element can be improved.

(3) The first oxide film has a thickness grown by a method that grows a thermal oxide film on silicon to a thickness of 60–80 angstrom, the second oxide film has a thickness of 100–200 angstrom, the nitride film has a thickness of 50–500 angstrom, and the third oxide film has a thickness grown by a method that grows a thermal oxide film on silicon to a thickness of 60–80 angstrom.

(4) The non-volatile memory transistor includes a floating gate, a control gate, and an intermediate insulation film located between the floating gate and the control gate.

The intermediate insulation film has a structure that includes a first oxide film, a second oxide film and a third oxide film successively provided in a direction from the floating gate toward the control gate.

(5) The first oxide film of the intermediate insulation film includes a thermal oxide film.

The second oxide film of the intermediate insulation film includes a CVD oxide film.

The third oxide film of the intermediate insulation film includes a thermal oxide film.

(6) The second oxide film of the intermediate insulation film in the semiconductor device includes a high-temperature CVD oxide film.

As a result, the second oxide film becomes a dense film, and therefore the dielectric strength of the intermediate insulation film can be improved.

(7) The first oxide film of the intermediate insulation film and the first oxide film of the dielectric film are formed in the same step.

The second oxide film of the intermediate insulation film and the second oxide film of the dielectric film are formed in the same step.

The third oxide film of the intermediate insulation film and the third oxide film of the dielectric film are formed in the same step.

As a result, the process for manufacturing the semiconductor device can be simplified.

(8) The intermediate insulation film includes a nitride film, wherein the nitride film of the intermediate insulation film is located below the sidewall of the floating gate and between the second oxide film of the intermediate insulation film and the third oxide film of the intermediate insulation film.

When a voltage (for example, a negative voltage) is applied to the control gate for operating the non-volatile memory transistor, the electric field may concentrate in the sidewall lower section of the floating gate. By the structure described above, the dielectric strength of the intermediate insulation film can be improved.

(9) The nitride film of the intermediate insulation film and the nitride film of the dielectric film are films that are formed in the same step.

As a result, the process for manufacturing the semiconductor device can be simplified.

(10) The control gate and the upper electrode are electrodes that are formed from polysilicon.

(11) The control gate and the upper electrode are electrodes that are formed from polycide.

Accordingly, the control gate and the upper electrode can be made to have a low resistance, and therefore the semiconductor device can achieve a higher operation speed.

(12) The control gate and the upper electrode are electrodes that are formed from metal.

Accordingly, the control gate and the upper electrode can be made to have a low resistance, and therefore the semiconductor device can achieve a higher operation speed.

(13) The control gate and the upper electrode are electrodes that are formed from salicide.

Accordingly, the control gate and the upper electrode can be made to have a low resistance, and therefore the semiconductor device can achieve a higher operation speed.

(14) The floating gate and the lower electrode are films that are formed in the same step, and the control gate and the upper electrode are films that are formed in the same step.

As a result, the process for manufacturing the semiconductor device can be simplified.

(15) The capacity element is a component of an analogue circuit.

(16) The non-volatile memory transistor includes a split-gate type non-volatile memory transistor.

[4] The present invention provides a method for manufacturing a semiconductor device having a structure that includes a non-volatile memory transistor and a capacitor element formed in one semiconductor substrate, wherein the non-volatile memory transistor includes a floating gate, an intermediate insulation film and a control gate, and the capacitor element includes a lower electrode, a dielectric film and an upper electrode. The method comprises the steps of:

(a) forming the floating gate and the lower electrode on the semiconductor substrate;
(b) forming a first oxide film on the floating gate and the lower electrode;
(c) forming a second oxide film on the first oxide film;
(d) forming a nitride film that becomes a component of the dielectric film on the second oxide film on the lower electrode;
(e) forming a third oxide film that becomes a component of the intermediate insulation film and a component of the dielectric film on the second oxide film on the sidewall of the floating gate and on the nitride film on the lower electrode, respectively; and
(f) forming, after the step (e), the control gate and the upper electrode on the semiconductor substrate.

In the method for manufacturing the semiconductor device in accordance with the present invention, the non-volatile memory transistor and the capacitor element having a dielectric film composed of an ONO film with a four-layered structure can be formed on a single semiconductor substrate.

The method for manufacturing the semiconductor device of the present invention includes the following embodiments.

(1) The step (a) includes the step of introducing an impurity in the lower electrode to provide the lower electrode with a predetermined impurity concentration.

The capacitor value of the capacitor element can be controlled by changing the impurity concentration in the lower electrode.

(2) The first oxide film is formed by thermal oxidation.
(3) The second oxide film is formed by CVD.
(4) The CVD includes a high-temperature CVD.

As a result, the second oxide film becomes a dense film, and therefore the dielectric strength of the capacitor element can be improved.

(5) The nitride film is formed by CVD.
(6) The third oxide film is formed by thermal oxidation.
(7) The step (d) includes the steps of:
forming a nitride film on the second oxide film;
forming a mask film on the nitride film on the second oxide film on the lower electrode; and
selectively removing the nitride film by an anisotropic etching, using the mask film as a mask, to leave the nitride film that becomes a component of the intermediate insulation film and a component of the dielectric film on the second oxide film on the sidewall lower section of the floating gate and on the second oxide film on the lower electrode, respectively.

As a result, the nitride film that becomes a component of the intermediate insulation film and a component of the dielectric film can be formed at the same time.

(8) The step (a) includes the step of forming a selective oxide film on the floating gate.

(9) The step of forming the selective oxide film includes the steps of: forming a conductive film on the semiconductor substrate; and forming the selective oxide film on the conductive film that becomes the floating gate.

(10) The floating gate is patterned, using the selective oxide film as a mask.

(11) The step (a) includes the step of forming a conductive film on the semiconductor substrate, and patterning the conductive film to form the floating gate and the lower electrode at the same time.

As a result, the process for manufacturing the semiconductor device can be simplified.

(12) The step (f) includes the steps of forming another conductive film on the semiconductor substrate, and patterning the another conductive film to form the control gate and the upper electrode at the same time.

Accordingly, the process for manufacturing the semiconductor device can be simplified.

(13) The non-volatile memory transistor includes a split-gate type non-volatile memory transistor.

DESCRIPTION OF PREFERRED EMBODIMENTS

First Embodiment

A semiconductor device and a method for manufacturing the same in accordance with a first embodiment of the present invention will be described below with reference to the accompanying drawings. FIG. 10 is a cross-sectional view of a semiconductor device in accordance with the first embodiment. The semiconductor device of the first embodiment includes a split-gate type memory transistor 51 and two capacitor elements 53 and 55 formed in the same chip (semiconductor substrate). FIGS. 1–9 are cross-sectional views of a semiconductor device in its manufacturing steps in accordance with the first embodiment.

Figure 1:
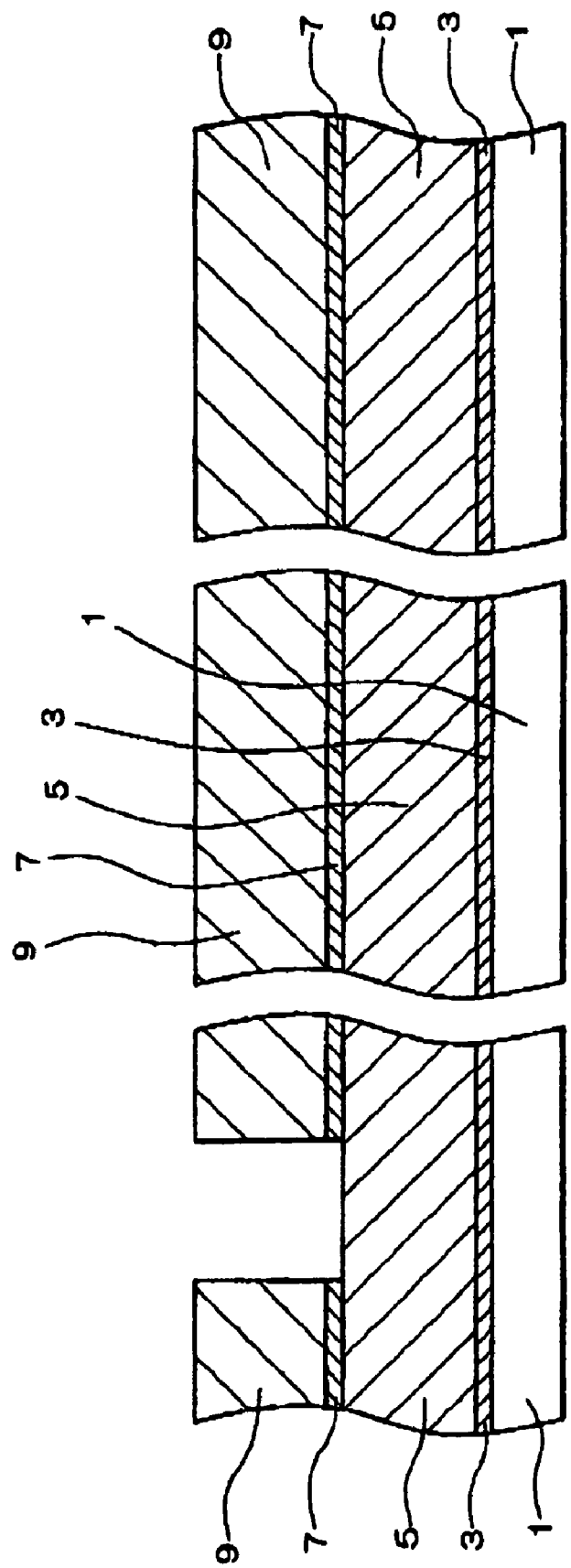
FIG. 1 is a cross-sectional view of a silicon substrate in a first step of a method for manufacturing a semiconductor device in accordance with a first embodiment of the present invention.

First, as shown in FIG. 1, a surface of a semiconductor substrate 1 is subject to a wet oxidation at a temperature about 850° C., to thereby form a gate oxide film 3, which is one example of a gate insulation film, on the semiconductor substrate 1. Then, a polycrystal silicon film 5 is deposited on the gate oxide film 3 by a reduced-pressure CVD (chemical vapor deposition) method to a film thickness of about 1200–1500 angstrom. The film thickness of the polycrystal silicon film 5 is to be greater than 1200 angstrom because of the following reasons. A selective oxide film 11 (to be described below) is formed by the oxidation of the polycrystal silicon film 5. Therefore, if the thickness of the polycrystal silicon film 5 is smaller than 1200 angstrom, a floating gate 17 (to be described below) cannot be formed to a specified film thickness. Also, the film thickness of the polycrystal silicon film 5 is to be smaller than 1500 angstrom because of the following reasons. When a silicon oxide film 25 is formed on a sidewall section of the floating gate 17 by a thermal oxidation step (to be described below), the silicon oxide film 25 does not sufficiently adhere to the sidewall section of the floating gate 17, and the silicon oxide film 25 becomes to be relatively thin. As a result, the dielectric strength of the silicon oxide film between the control gate and the floating gate deteriorates. Due to the reasons described above, the thickness of the polycrystal silicon film 5 is preferably made smaller than 1500 angstrom.

Next, an anti-oxidation film 7 that is composed of a silicon nitride film having a thickness of about 800–1000 angstrom is deposited on the polycrystal silicon film 5. Then, a photoresist film 9 is coated on the anti-oxidation film 7, and the photoresist film 9 is exposed to light and developed. By this step, an opening section is formed in a region wherein a floating gate is designed to be formed. Then, the anti-oxidation film 7 that is exposed through the opening is dry-etched, using the photoresist film 9 as a mask, to form an opening in the anti-oxidation film 7. Then, the photoresist film 9 is removed.

Figure 2:
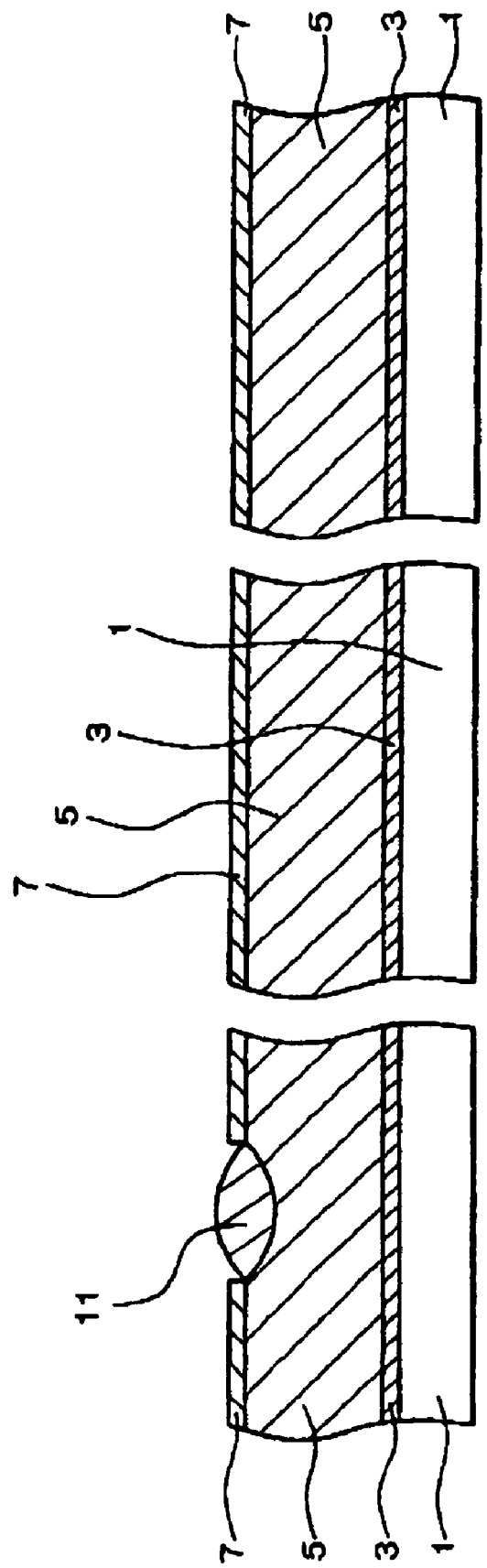
FIG. 2 is a cross-sectional view of the silicon substrate in a second step of a method for manufacturing a semiconductor device in accordance with the first embodiment of the present invention.

Then, as shown in FIG. 2, the polycrystal silicon film 5 that is exposed through the opening is selectively oxidized, using the anti-oxidation film 7 as a mask, to form a selective oxide film 11 on the polycrystal silicon film 5.

Figure 3:
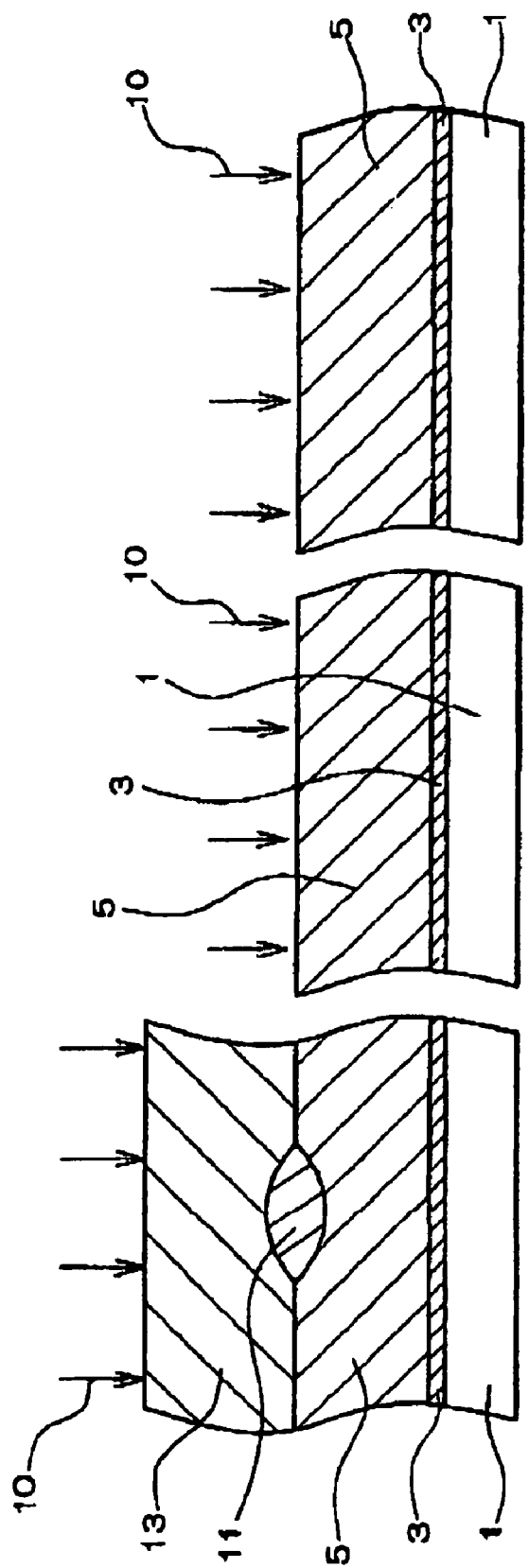
FIG. 3 is a cross-sectional view of the silicon substrate in a third step of a method for manufacturing a semiconductor device in accordance with the first embodiment of the present invention.

Next, as shown in FIG. 3, the anti-oxidation film 7 is removed by a heated phosphoric acid. Then, a photoresist film 13 is coated on the selective oxide film 11 and the polycrystal silicon film 5. The photoresist film 13 is then exposed to light and developed. By this step, openings are formed in areas where capacitor elements 53 and 55 are formed. Then, an impurity 10 is ion-implanted in the polycrystal silicon film 5 with a first dose (for example, a dose of $5 \times 10^{16}/cm^2$), using the photoresist film 13 as a mask. The impurity 10 to be ion-implanted is, for example, phosphorous. As a result, the impurity 10 is introduced in the polycrystal silicon film 5 in regions where the capacitor elements 53 and 55 are formed.

Figure 4:
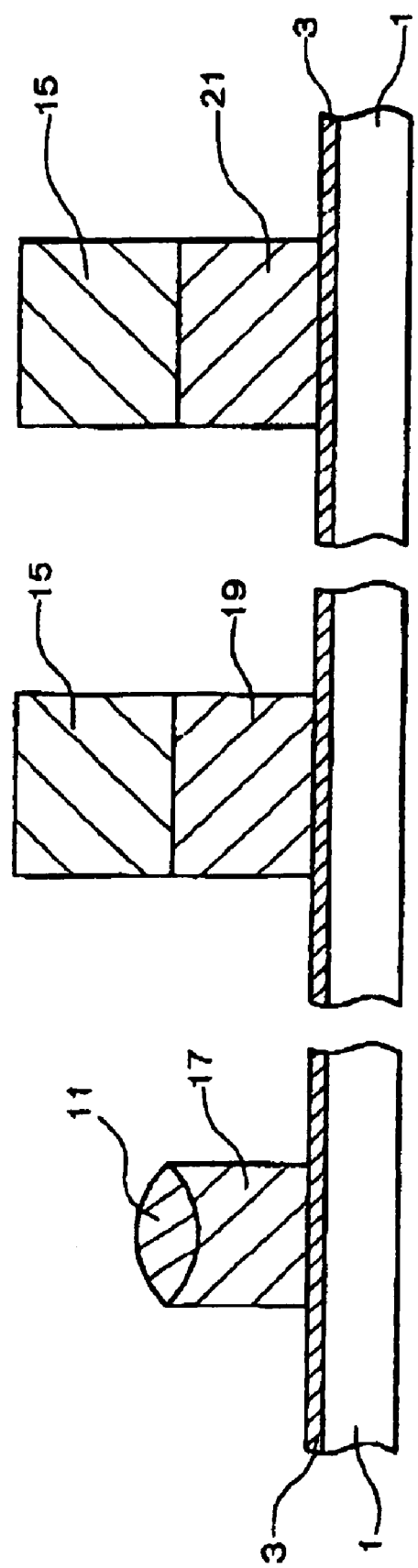
FIG. 4 is a cross-sectional view of the silicon substrate in a fourth step of a method for manufacturing a semiconductor device in accordance with the first embodiment of the present invention.

Then, as shown in FIG. 4, after removing the photoresist film 13, a photoresist film 15 is coated over the entire surface, and the photoresist film 15 is exposed and developed. By this step, resist patterns 15 are formed on regions where the capacitor elements are formed. Then, the polycrystal silicon film 5 is anisotropically etched in a vertical direction, using the resist pattern 15 and the selective oxide film 11 as a mask. As a result, a floating gate 17 is formed below the selective oxide film 11, and lower electrodes 19 and 21 of a first capacitor element and a second capacitor element are formed under the photoresist films 15. An upper face area of the lower electrode 19 is the same as an upper face area of the lower electrode 21.

Figure 5:
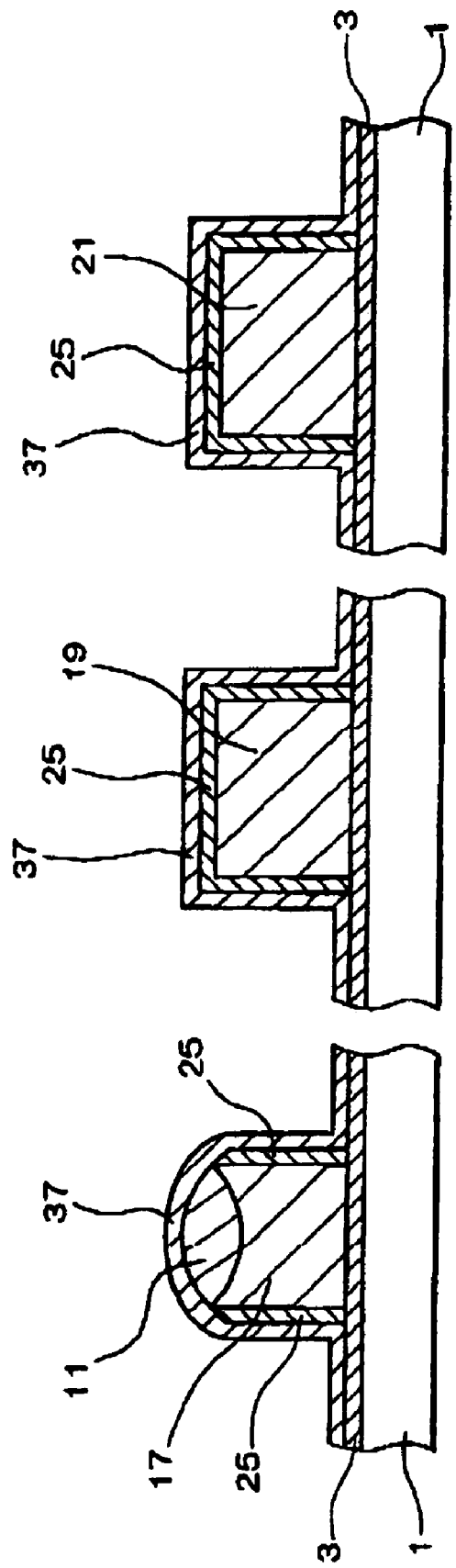
FIG. 5 is a cross-sectional view of the silicon substrate in a fifth step of a method for manufacturing a semiconductor device in accordance with the first embodiment of the present invention.

Then, as shown in FIG. 5, the photoresist films 15 are removed. Then, for example, a silicon oxide film 25 having a thickness of about 60–80 angstrom is formed by a thermal oxidation on surfaces of the lower electrodes 19 and 21 of the capacitor elements and the sidewall of the floating gate 17. At this moment, an oxide film rarely grows on the gate oxide film 3 and the thick selective oxide film 11. It is noted that the "thickness of about 60–80 angstrom" means a film thickness grown by a method in which a thermal oxide film having a thickness of about 60–80 angstrom grows on silicon. Hereunder, the same applies to a film thickness that is obtained by a thermal oxidation.

Next, a silicon oxide film 37 is deposited over the entire surface including the silicon oxide film 25 and the selective oxide film 11 to a thickness of about 150 angstrom by, for example, a high-temperature CVD method at temperatures of 750° C.–850° C. The silicon oxide film 37 becomes a dense film because it is formed by a high-temperature CVD method. As a result, an intermediate insulation film of a split-gate type memory transistor 51 has an improved dielectric strength.

Figure 6:
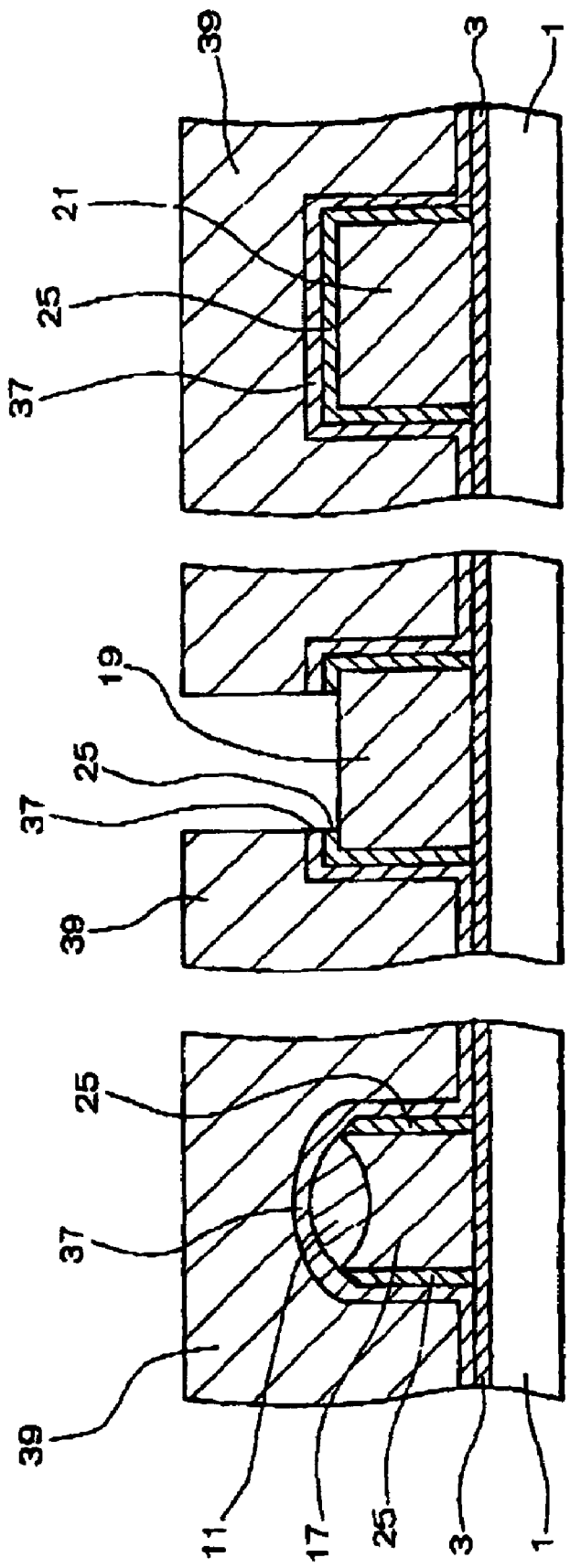
FIG. 6 is a cross-sectional view of the silicon substrate in a sixth step of a method for manufacturing a semiconductor device in accordance with the first embodiment of the present invention.

Next, as shown in FIG. 6, a photoresist film 39 is coated on the entire surface, and the photoresist film 39 is exposed to light and developed. As a result, an opening is formed in a region where the capacitor element 53 is formed. Then, the silicon oxide film 37 that is exposed and the silicon oxide film 25 therebelow are removed by a wet etching. As a result, a part of the lower electrode 19 is exposed.

Figure 7:
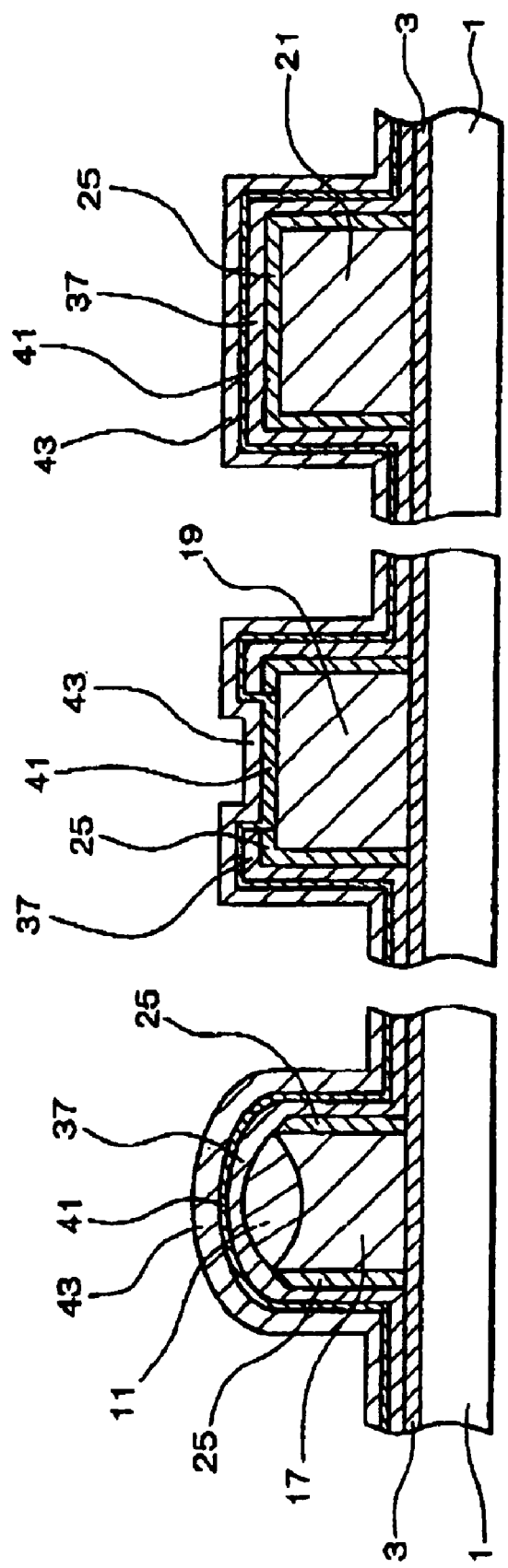
FIG. 7 is a cross-sectional view of the silicon substrate in a seventh step of a method for manufacturing a semiconductor device in accordance with the first embodiment of the present invention.

Then, as shown in FIG. 7, the photoresist film 39 is removed. Then, a silicon oxide film 41 having a thickness of about 100 angstrom is formed by, for example, a thermal oxidation on surfaces of the lower electrode 19 and the silicon oxide film 37. In this step, an oxide film rarely grows on the silicon oxide film 37. As a result, the thickness of the silicon oxide film 41 on the silicon oxide film 37 is smaller than the thickness of the silicon oxide film 41 on the lower electrode 19. Then, a silicon nitride film 43 having a thickness of about 150 angstrom is deposited on the silicon oxide film 41 by, for example, a CVD method.

Figure 8:
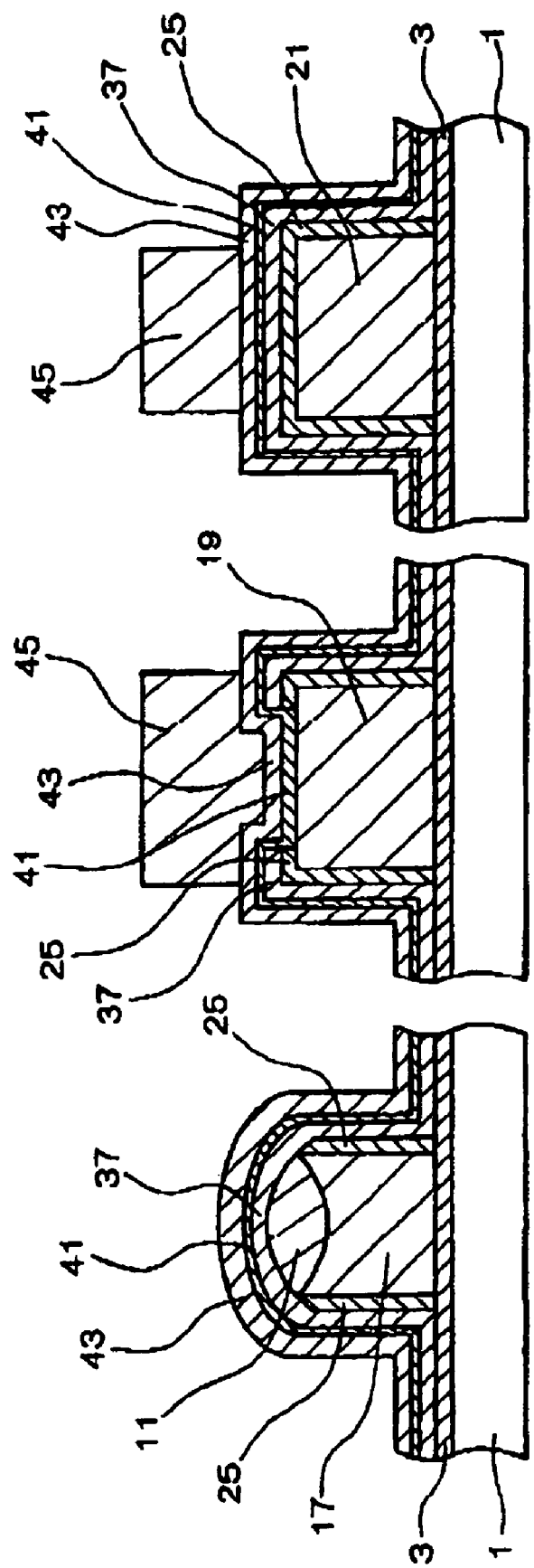
FIG. 8 is a cross-sectional view of the silicon substrate in a eighth step of a method for manufacturing a semiconductor device in accordance with the first embodiment of the present invention.

Then, as shown in FIG. 8, a photoresist film 45 is coated on the silicon nitride film 43, and the silicon nitride film 45 is exposed to light and developed. As a result, resist patterns 45 are formed on the lower electrodes 19 and 21 of the capacitor elements.

Figure 9:
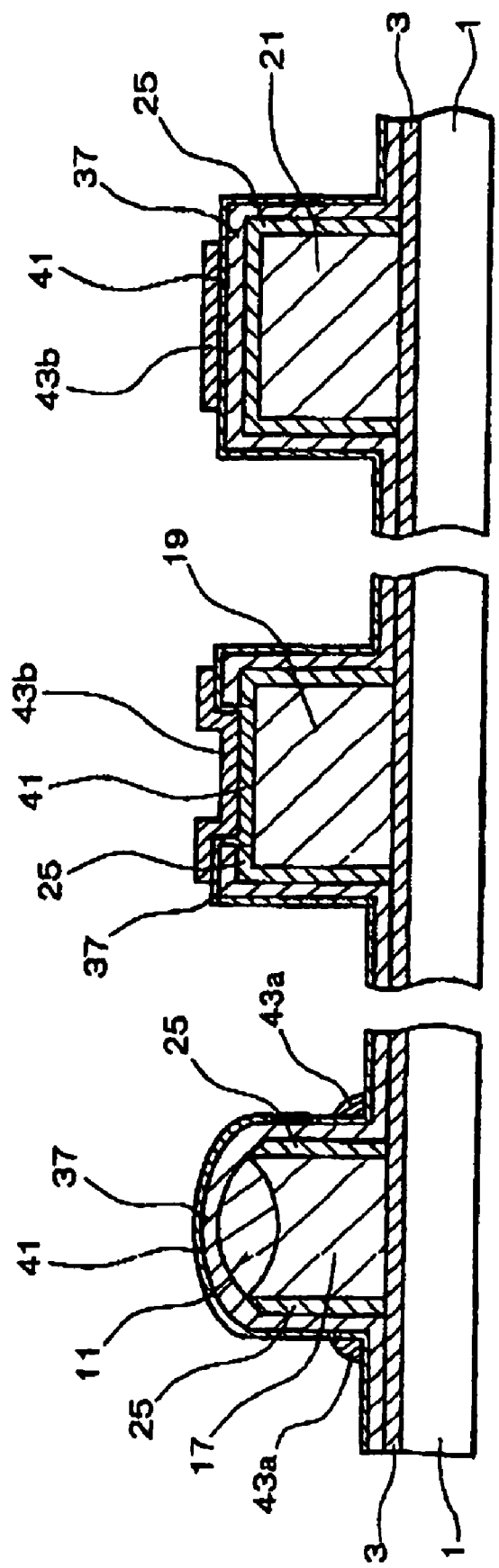
FIG. 9 is a cross-sectional view of the silicon substrate in a ninth step of a method for manufacturing a semiconductor device in accordance with the first embodiment of the present invention.
Figure 10:
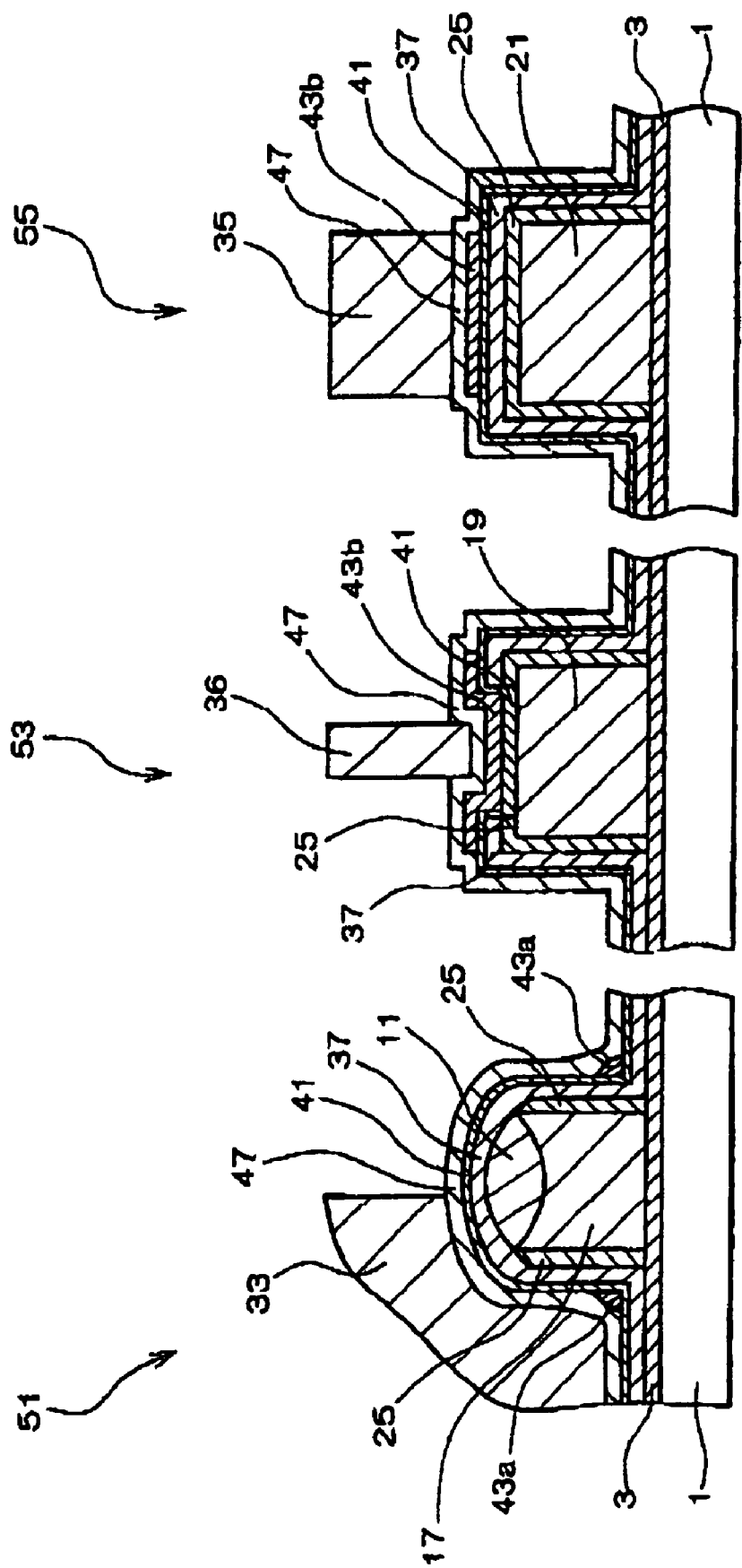
FIG. 10 is a cross-sectional view of a semiconductor device in accordance with the first embodiment of the present invention.

Then, as shown in FIG. 9, the silicon nitride film 43 is anisotropically etched in a vertical direction, using the resist patters 45 as a mask. By this step, side-section insulation films 43a are formed on a lower section of the sidewall of the floating gate 17, and silicon nitride film films 43b are formed on the lower electrodes 19 and 21.

Then, as shown in FIG. 10, a silicon oxide film 47 is deposited to a thickness of about 100 angstrom over the entire surface including the lower side sections 43a of the silicon nitride film, the silicon nitride films 43b and the silicon oxide film 41 by, for example, a CVD method.

A polycrystal silicon film is deposited on the silicon oxide film 47 by a reduced-pressure CVD method. Phosphorous ions are diffused in the polycrystal silicon film in a $POCl_3$ atmosphere, and then the polycrystal silicon film is patterned.

As a result, the polycrystal silicon film remains in an area extending from a location on the selective oxide film 11 through one side of the floating gate 17 to a location on the silicon substrate 1. The remaining polycrystal silicon film serves as a control gate 33. Also, the polycrystal silicon film remains over the lower electrode 19 through the silicon oxide film 41, the silicon nitride film 43b and the silicon oxide film 47. The remaining polycrystal silicon film serves as an upper electrode 36 of the capacitor element 53. Moreover, the polycrystal silicon film remains over the lower electrode 21 through the silicon oxide film 25, the silicon oxide film 37, the silicon oxide film 41, the silicon nitride film 43b and the silicon oxide film 47. The remaining polycrystal silicon film serves as an upper electrode 35 of the capacitor element 55.

Then, an impurity is introduced in the silicon substrate 1 on both sides of the control gate 33 and the floating gate 17 to thereby form diffusion layers (not shown) for source and drain regions in the silicon substrate.

Main effects of the first embodiment will be described below.

As shown in FIG. 10, in accordance with the first embodiment, the split-gate type memory transistor 51 and the capacitor elements 53 and 55 can be readily mixed and mounted on the same silicon substrate 1. As a result, the number of chips can be reduced, compared to a conventional apparatus in which these device elements are formed on independent chips. Consequently, the product cost can be reduced.

In accordance with the first embodiment, the capacitor element 53 is formed from the lower electrode 19, the ONO film (including the silicon oxide film 41, the silicon nitride film 43b and silicon oxide film 47) as a dielectric film and the upper electrode 36. The capacitor element 55 is formed from the lower electrode 21, the ONO film (including the silicon oxide film 25, the silicon oxide film 37, the silicon oxide film 41, the silicon nitride film 43b and the silicon oxide film 47) and the upper electrode 35. In this manner, the dielectric film of the capacitor element 55 includes elements that are different from elements of the dielectric film of the capacitor element 53. In other words, the dielectric film of the capacitor element 55 has a film thickness that is different from a film thickness of the dielectric film of the capacitor element 53. Accordingly, in accordance with the first embodiment, the capacitor values of the capacitor element 53 and the capacitor element 55 can be independently set to any desired values.

The dielectric film of the capacitor element 55 includes elements that are different from those of the dielectric film of the capacitor element 53 because of the provision of the step shown in FIG. 6 in which the silicon oxide film is removed only in a region where the capacitor element 53 is formed.

Also, in accordance with the first embodiment, the dielectric films of the capacitor elements 53 and 55 can be formed from ONO films. This is because the side section insulation films 43a that are composed of silicon nitride films are formed at the lower sidewall section of the floating gate at the same time when the silicon nitride films 43b are formed over the lower electrodes 19 and 21 through the silicon oxide films 41.

Second Embodiment

Figure 12:
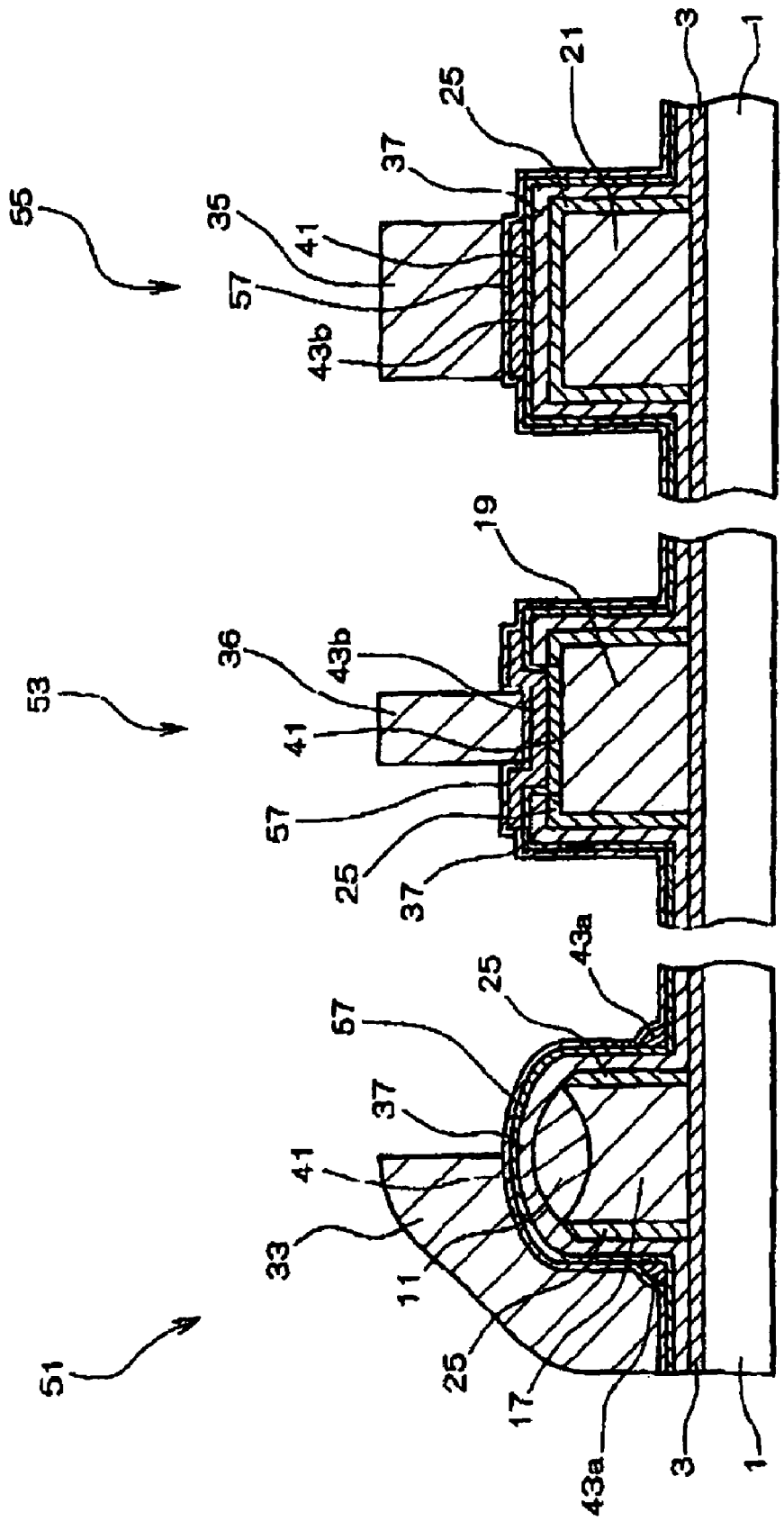
FIG. 12 is a cross-sectional view of a semiconductor device in accordance with the second embodiment of the present invention.

FIG. 12 is a cross-sectional view of a semiconductor device in accordance with a second embodiment of the present invention. The semiconductor device of the second embodiment has a split-gate type memory transistor 51, and two capacitor elements 53 and 55 that are formed in the same chip (semiconductor substrate). Elements having equivalent functions as those of the first embodiment are referred to by the same reference numbers. Features of the second embodiment that are different from the first embodiment will be described.

In the second embodiment, a silicon oxide film 57 that is formed by a thermal oxidation is provided instead of the silicon oxide 47 (see FIG. 10) formed by a CVD method.

Figure 11:
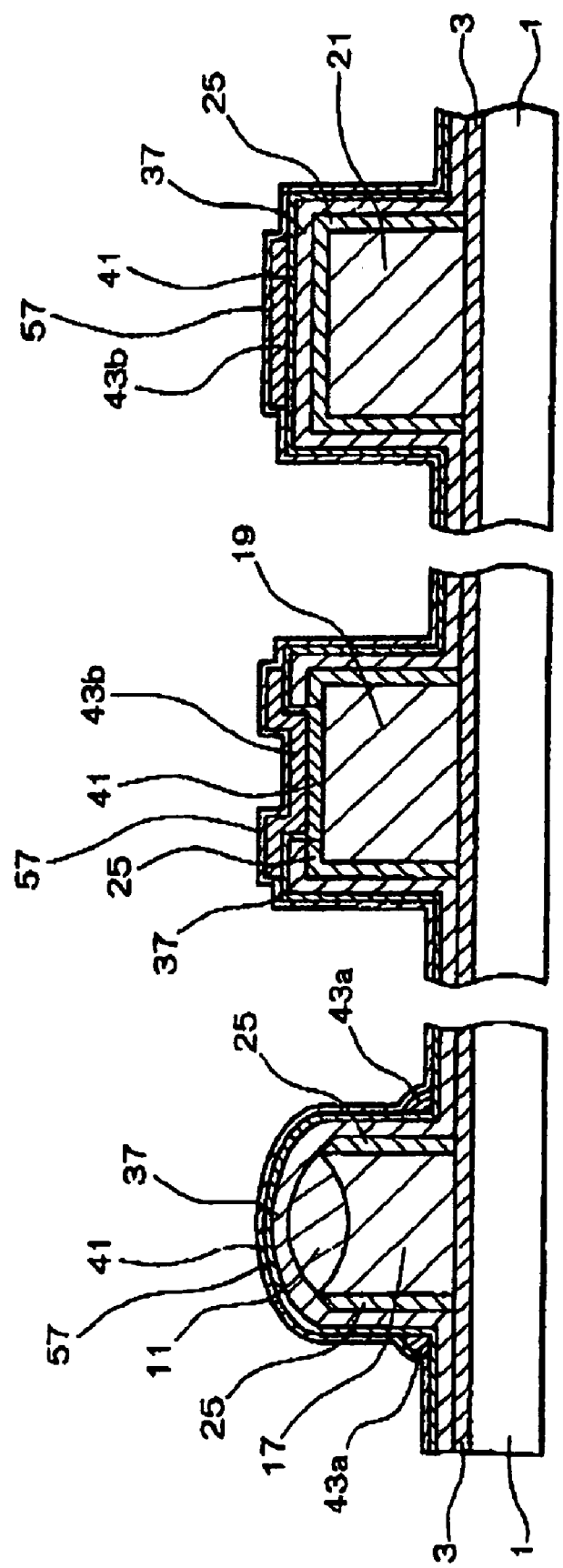
FIG. 11 is a cross-sectional view of a silicon substrate in a step of a method for manufacturing a semiconductor device in accordance with a second embodiment of the present invention.

In the second embodiment, the same steps as those of the first embodiment can be used up to the step of forming the side section insulation films 43a composed of silicon nitride films and the silicon nitride films 43b. After the side section insulation films 43a and the silicon nitride films 43b are formed, as shown in FIG. 11, a silicon oxide film 57 having a thickness of about 60–80 angstrom is deposited by a thermal oxidation over the entire surface including the side section insulation films 43a, the silicon nitride films 43b and the silicon oxide films 41. Then, a control gate 33 and upper electrodes 35 and 36 are formed, using the same method of the first embodiment.

In accordance with the second embodiment, when circuits including field effect transistors (for example, SRAMs) are mixed and formed in the silicon substrate 1, gate oxide films of the field effect transistors can be formed when the silicon oxide film 57 is formed.

Third Embodiment

Figure 13:
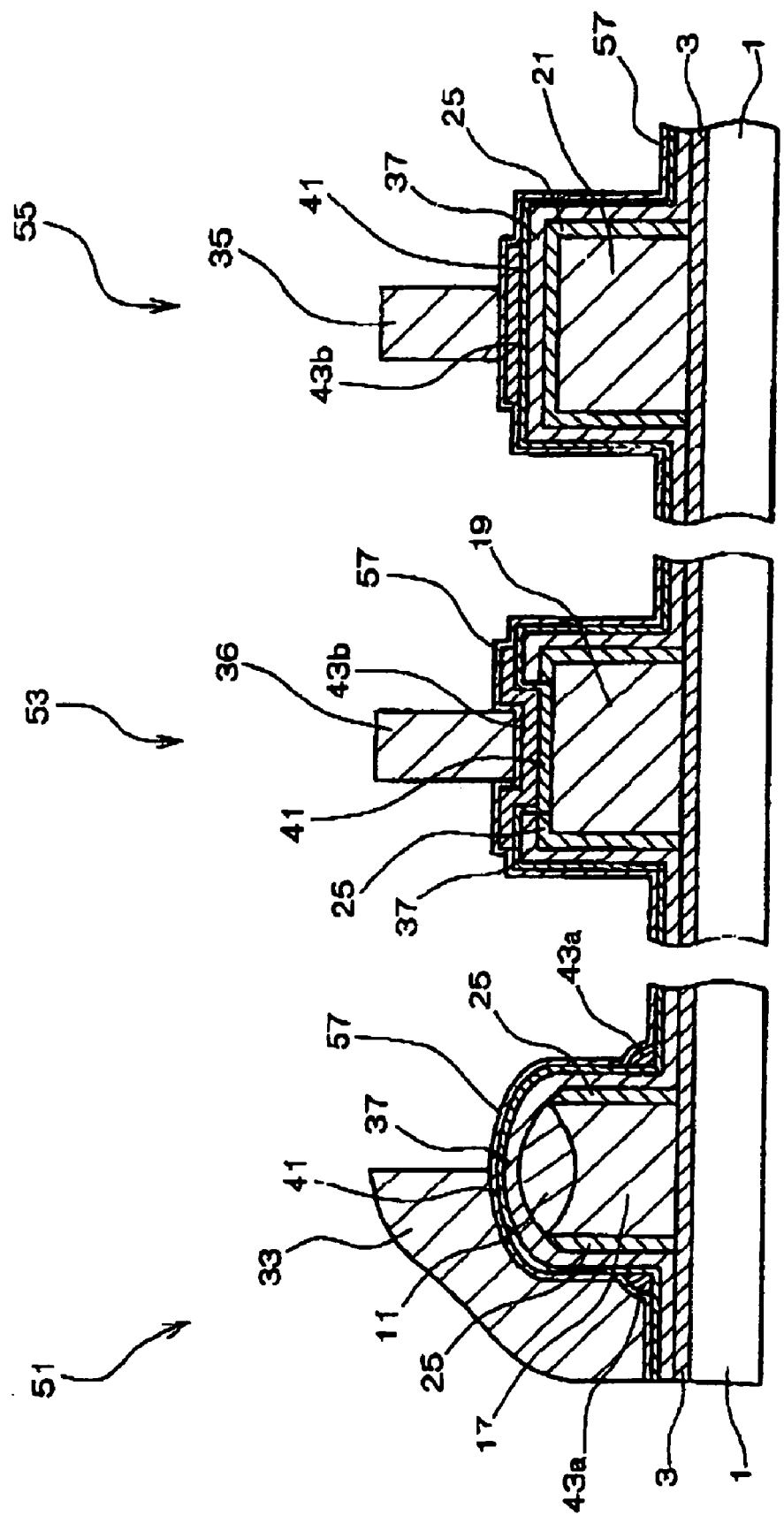
FIG. 13 is a cross-sectional view of a semiconductor device in accordance with a third embodiment of the present invention.

FIG. 13 is a cross-sectional view of a semiconductor device in accordance with a third embodiment of the present invention. The semiconductor device of the third embodiment has a split-gate type memory transistor 51, and two capacitor elements 53 and 55 that are formed in the same chip (semiconductor substrate), in a similar manner as the first and second embodiments. Elements having equivalent functions as those of the first and second embodiments are referred to by the same reference numbers. Features of the third embodiment that are different from the first and second embodiments will be described.

In accordance with the third embodiment, an area of the upper electrode 35 that faces the dielectric film is the same as that of the upper electrode 36 that faces the dielectric film.

The components of the capacitor element 53 are different from those of the capacitor element 55 (i.e., resulting in different thickness). Therefore, in accordance with the third embodiment, the capacitor element 53 and the capacitor element 55 have different capacitor values.

In contrast, in accordance with the first embodiment shown in FIG. 10 and the second embodiment shown in FIG. 12, an area of the upper electrode 35 that faces the dielectric film is different from that of the upper electrode 36 that faces the dielectric film. Consequently, the capacitor elements 53 and 55 have different capacitor values per unit area. As a result, the following results are provided. There are occasions where a semiconductor device is designed with the use of the previous generation technology. For example, in the previous generation technology, an area of an upper electrode of a capacitor element A that faces a dielectric film is different from that of an upper electrode of a capacitor element B that faces a dielectric film and, the capacitor value of the capacitor element A and the capacitor value of the capacitor element B are different from each other. However, in accordance with the first embodiment and the second embodiment, while using the design technology in which areas of the upper electrodes that face the dielectric films are different from each other, the capacitor values of the capacitor elements A and B can be made equal to each other.

Fourth Embodiment

Figure 21:
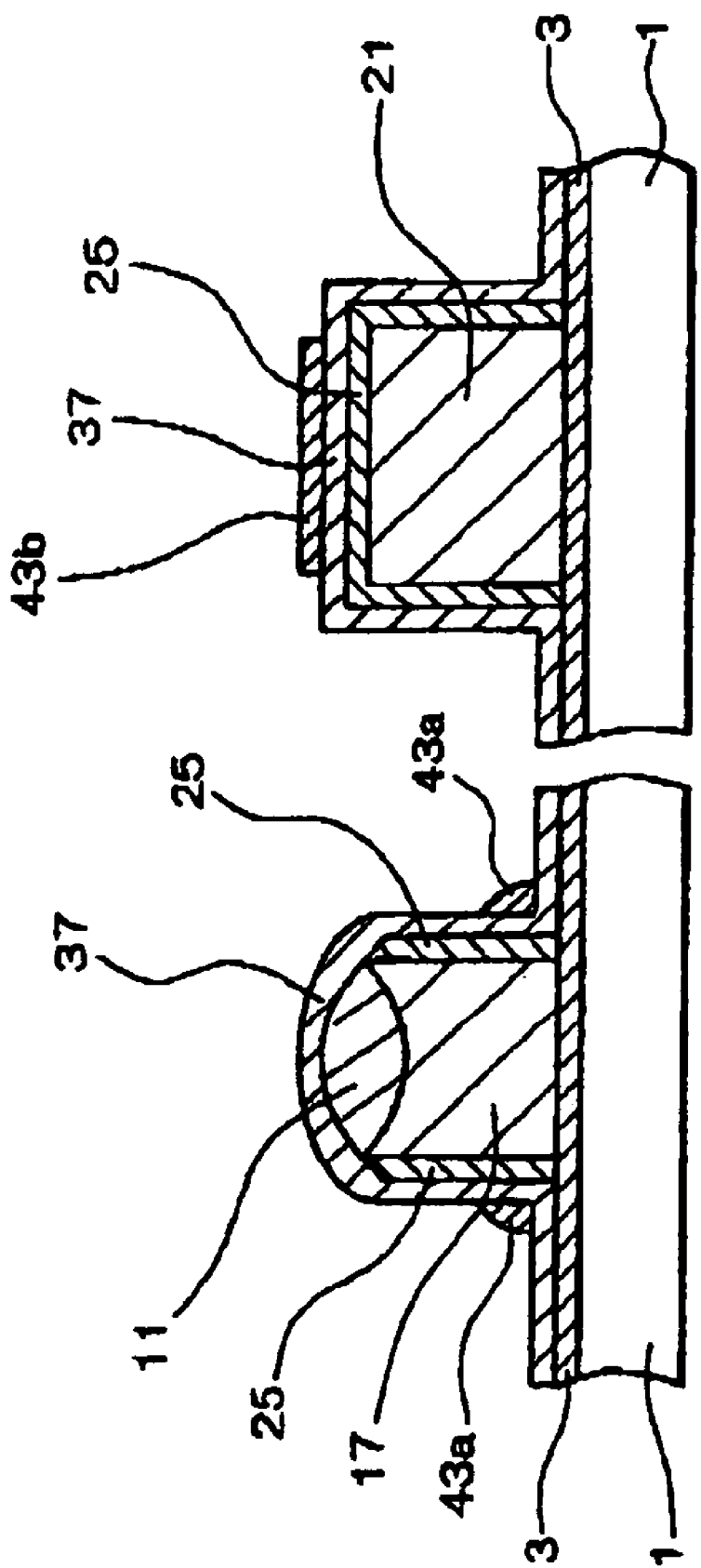
FIG. 21 is a cross-sectional view of the silicon substrate in a eighth step of a method for manufacturing a semiconductor device in accordance with the fourth embodiment of the present invention.
Figure 22:
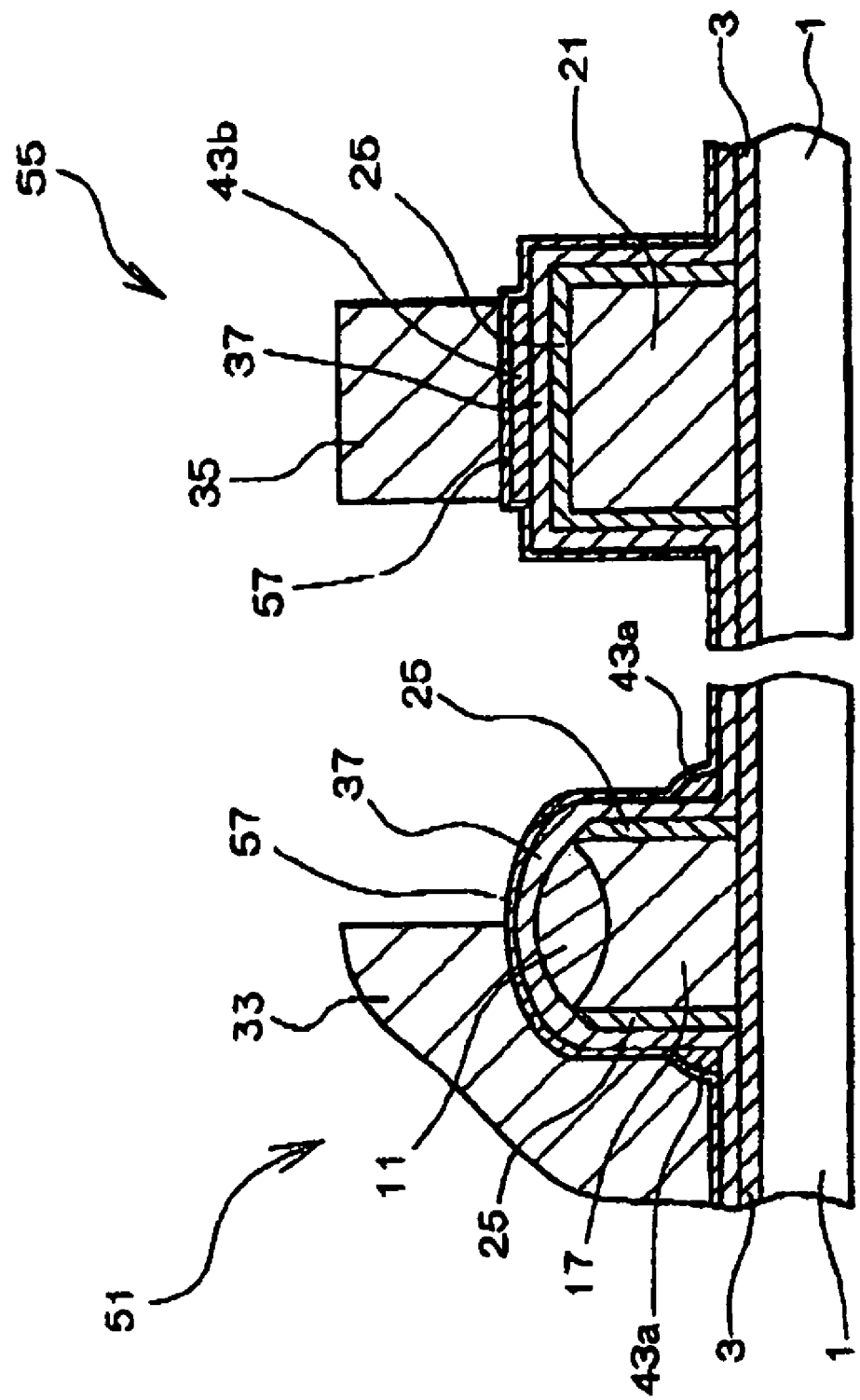
FIG. 22 is a cross-sectional view of a semiconductor device in accordance with a fourth embodiment of the present invention.

FIG. 22 is a cross-sectional view of a semiconductor device in accordance with a fourth embodiment of the present invention. Elements having equivalent functions as those of the first, second and third embodiments are referred to by the same reference numbers. The semiconductor device of the fourth embodiment has a split-gate type memory transistor 51 and a capacitor element 55 that are formed in the same chip (semiconductor substrate). FIGS. 14–21 are cross-sectional views of a semiconductor device in a manufacturing process in accordance with the fourth embodiment of the present invention.

Figure 14:
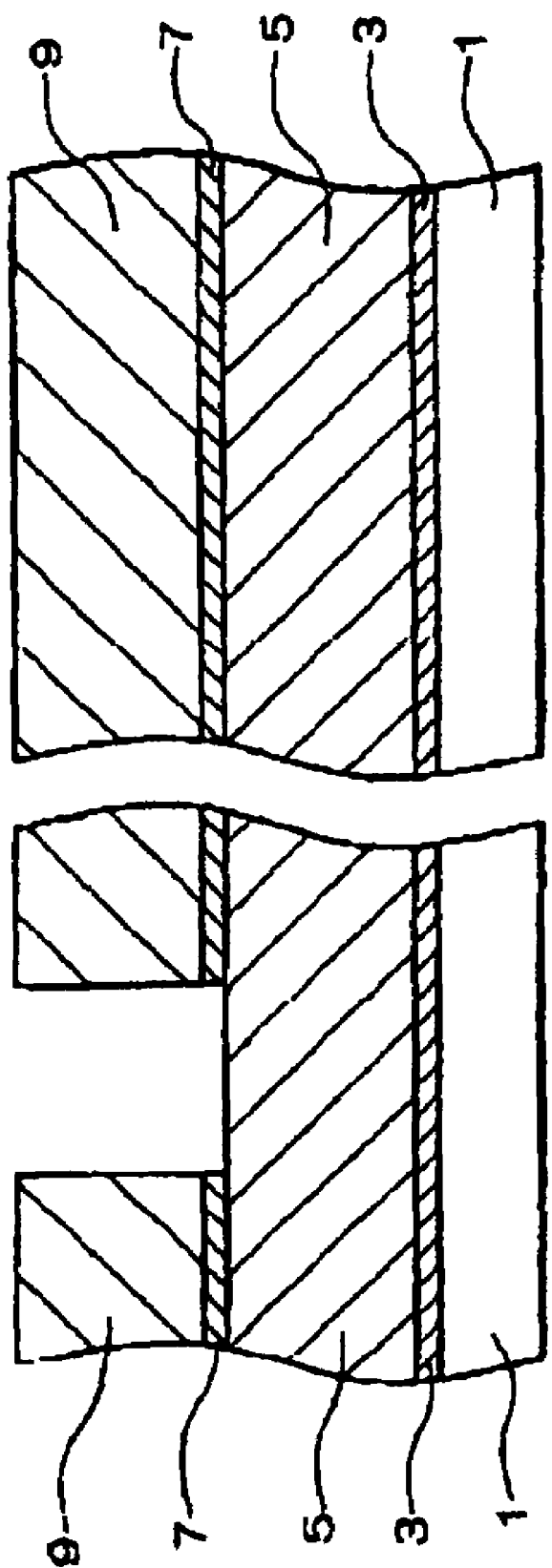
FIG. 14 is a cross-sectional view of a silicon substrate in a first step of a method for manufacturing a semiconductor device in accordance with a fourth embodiment of the present invention.
Figure 15:
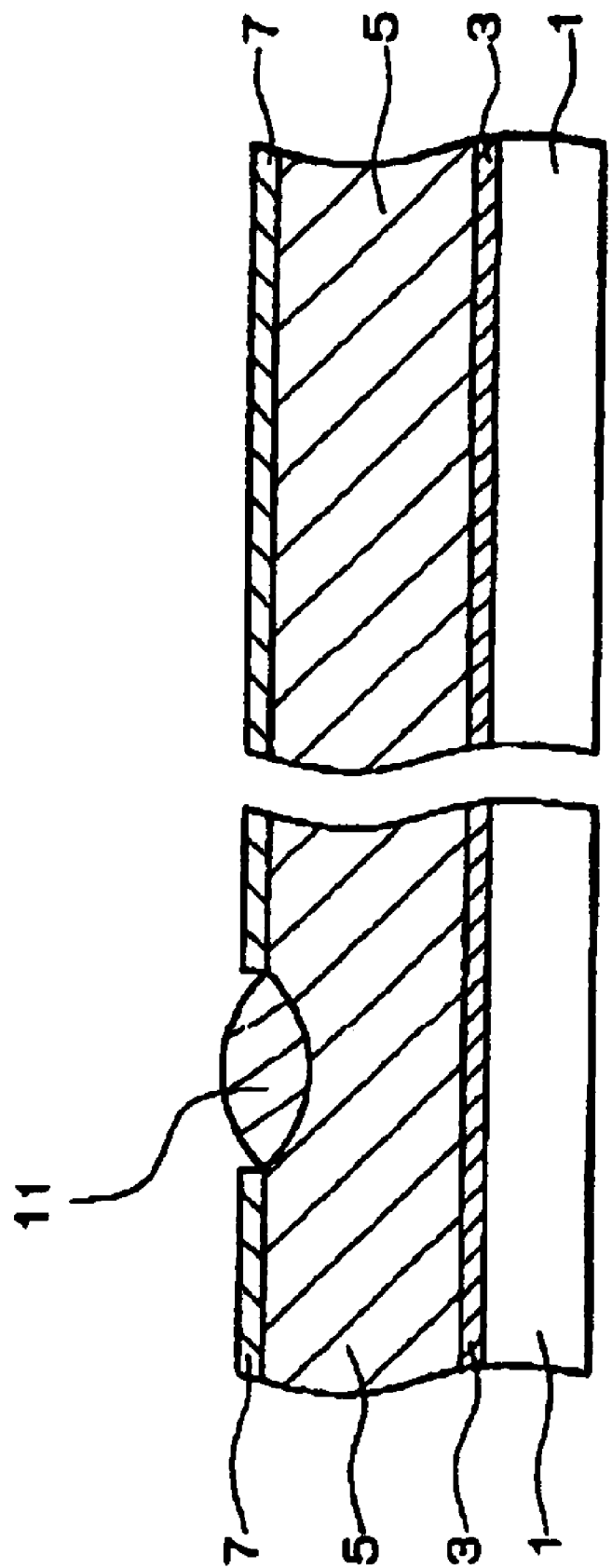
FIG. 15 is a cross-sectional view of the silicon substrate in a second step of a method for manufacturing a semiconductor device in accordance with the fourth embodiment of the present invention.
Figure 16:
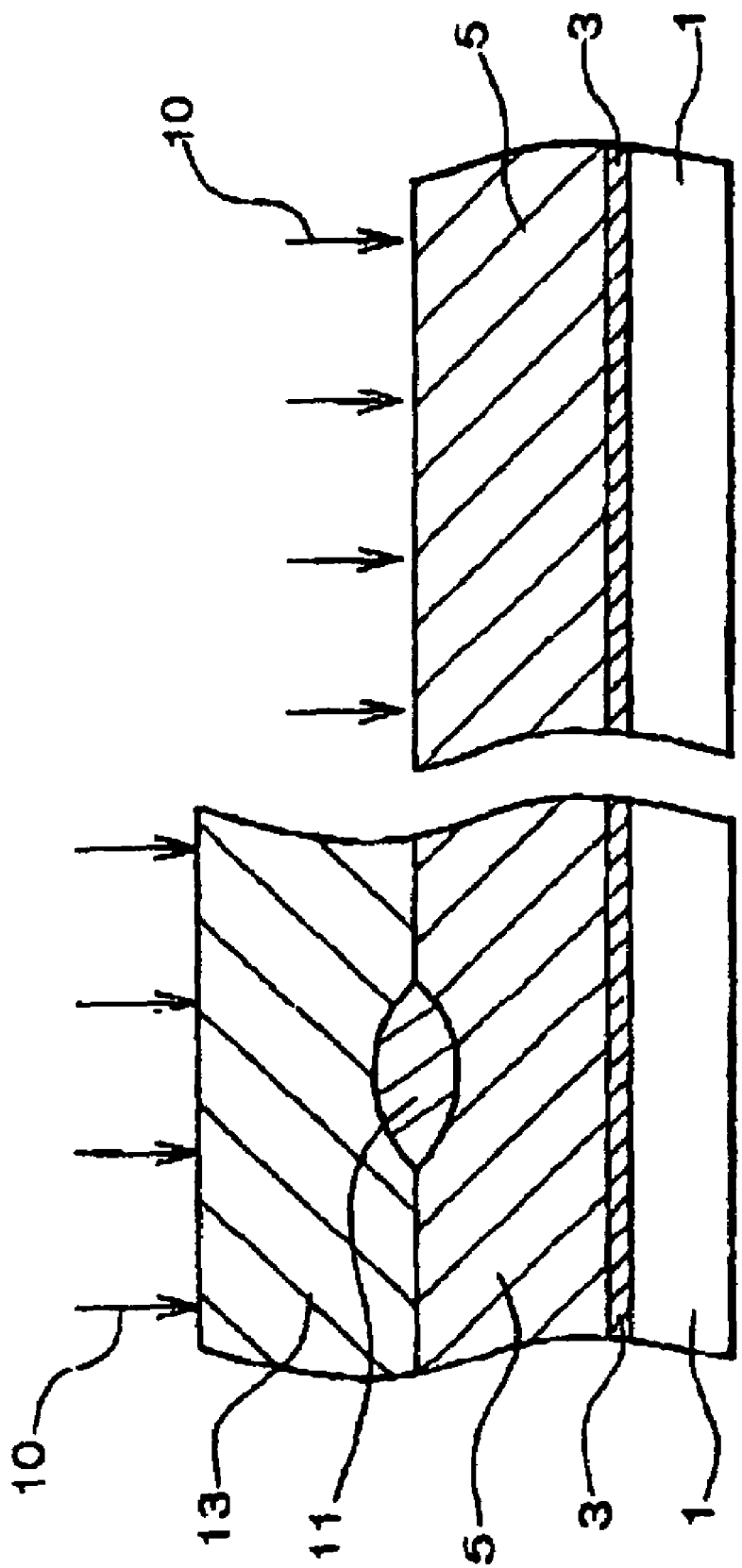
FIG. 16 is a cross-sectional view of the silicon substrate in a third step of a method for manufacturing a semiconductor device in accordance with the fourth embodiment of the present invention.
Figure 17:
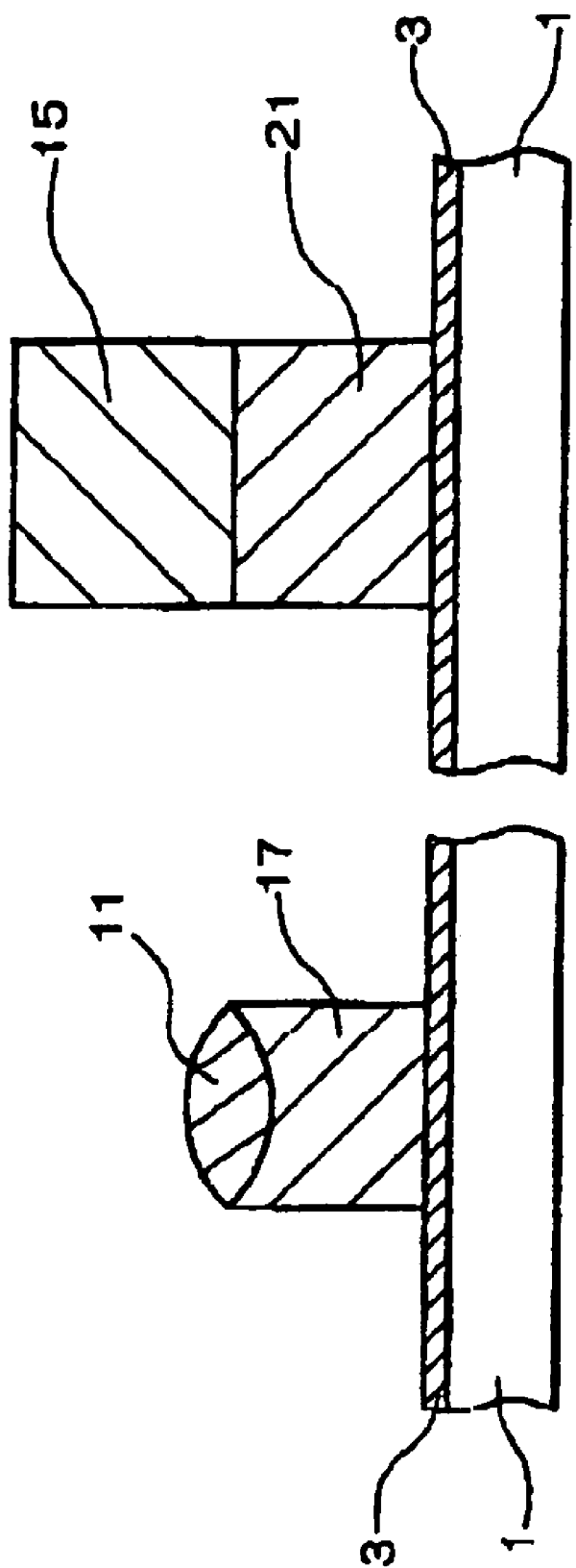
FIG. 17 is a cross-sectional view of the silicon substrate in a fourth step of a method for manufacturing a semiconductor device in accordance with the fourth embodiment of the present invention.

First, a process step shown in FIG. 14 is conducted. The process step is the same as the step shown in FIG. 1. Then, a process step shown in FIG. 15 is conducted. The step is the same as the step shown in FIG. 2. Then, a process step shown in FIG. 16 is conducted. This step is the same as the step shown in FIG. 3. Then, a process step shown in FIG. 17 is conducted. This step is the same as the step shown in FIG. 4. However, the patterning is not conducted for the lower electrode 19.

Figure 18:
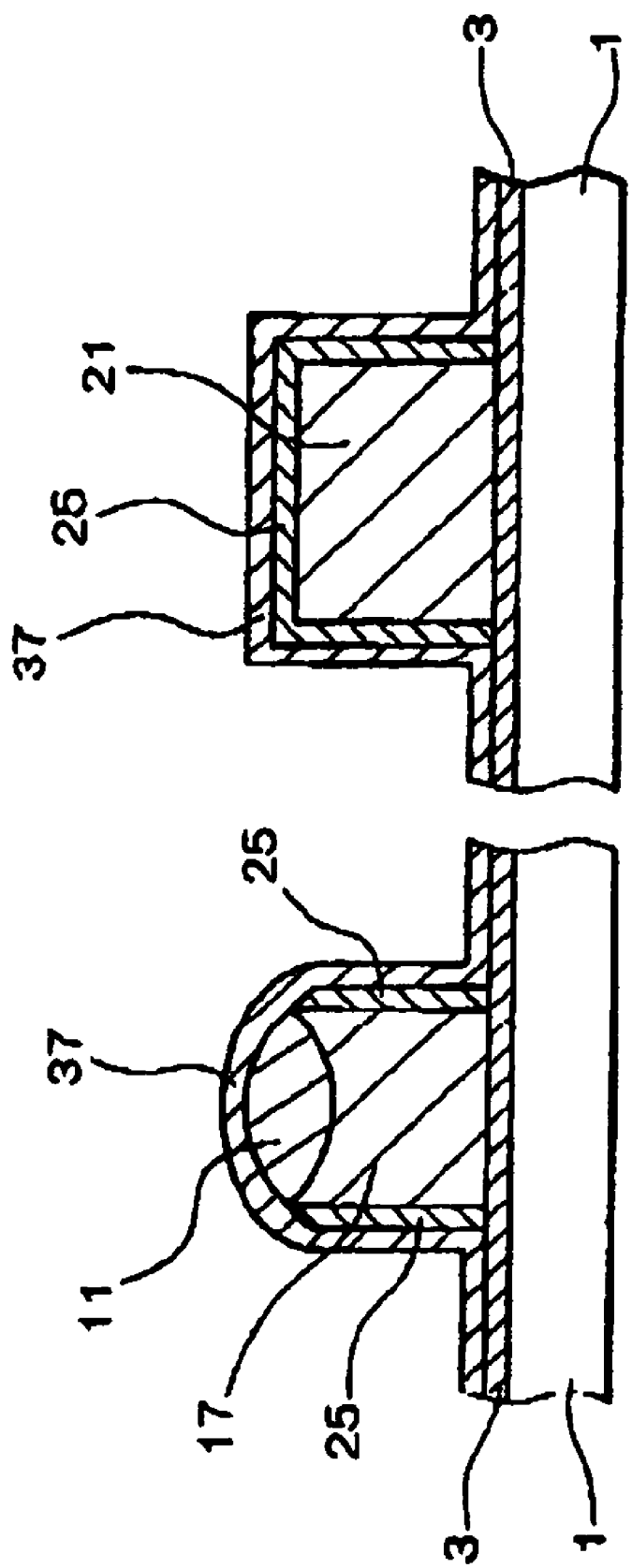
FIG. 18 is a cross-sectional view of the silicon substrate in a fifth step of a method for manufacturing a semiconductor device in accordance with the fourth embodiment of the present invention.

Then, as shown in FIG. 18, the photoresist films 15 are removed. Then, a silicon oxide film 25 having a thickness of about 60–80 angstrom is formed by a thermal oxidation, for example, on surfaces of the lower electrode 21 of the capacitor element and the sidewall of the floating gate 17. In this step, an oxide film rarely grows on the gate oxide film 3 and the thick selective oxide film 11.

Next, a silicon oxide film 37 is deposited over the entire surface including the silicon oxide film 25 and the selective oxide film 11 to a thickness of about 100–200 angstrom by, for example, a high-temperature CVD method at temperatures of 750° C.–850° C.

Figure 19:
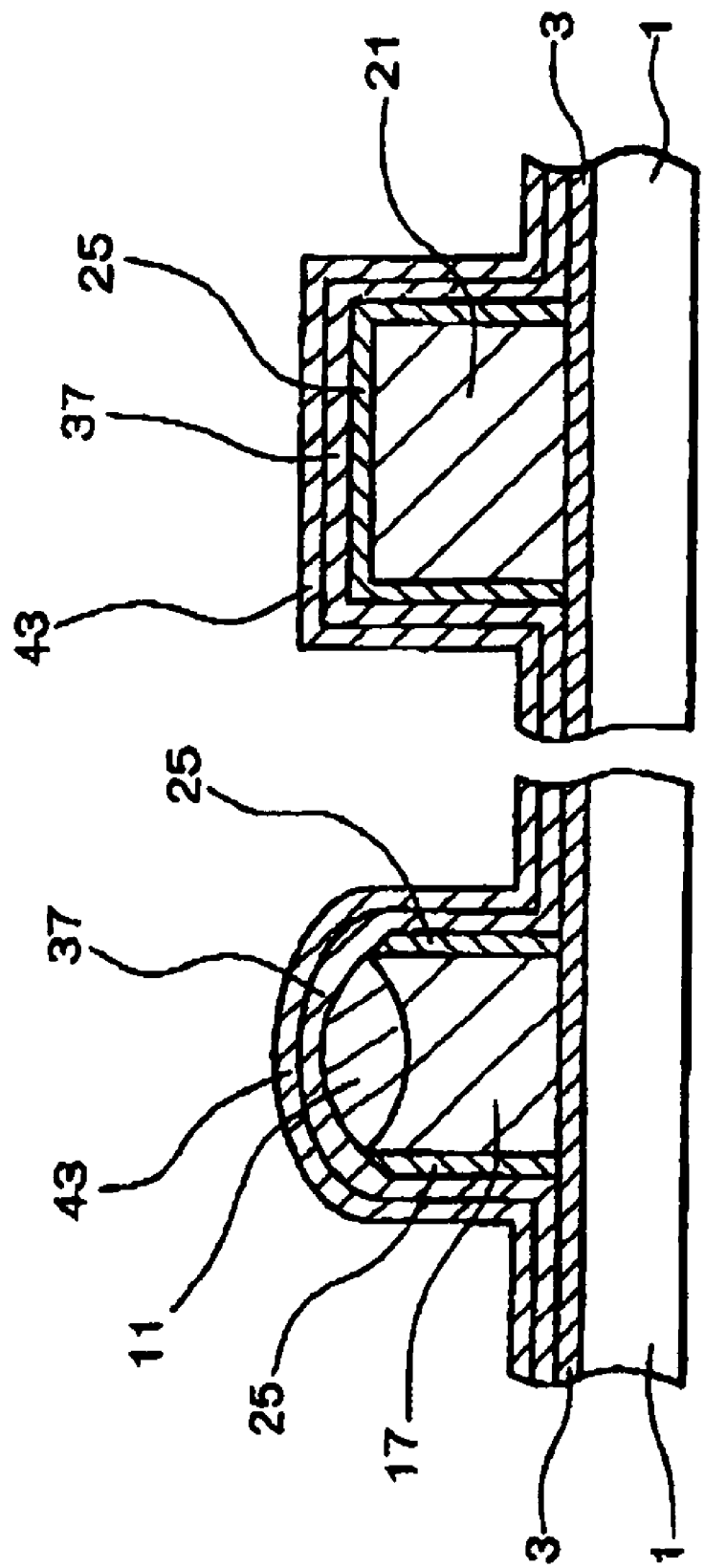
FIG. 19 is a cross-sectional view of the silicon substrate in a sixth step of a method for manufacturing a semiconductor device in accordance with the fourth embodiment of the present invention.

As shown in FIG. 19, a silicon nitride film 43 is deposited on the silicon oxide film 37 by, for example, a CVD method, to a thickness of about 50–500 angstrom.

Figure 20:
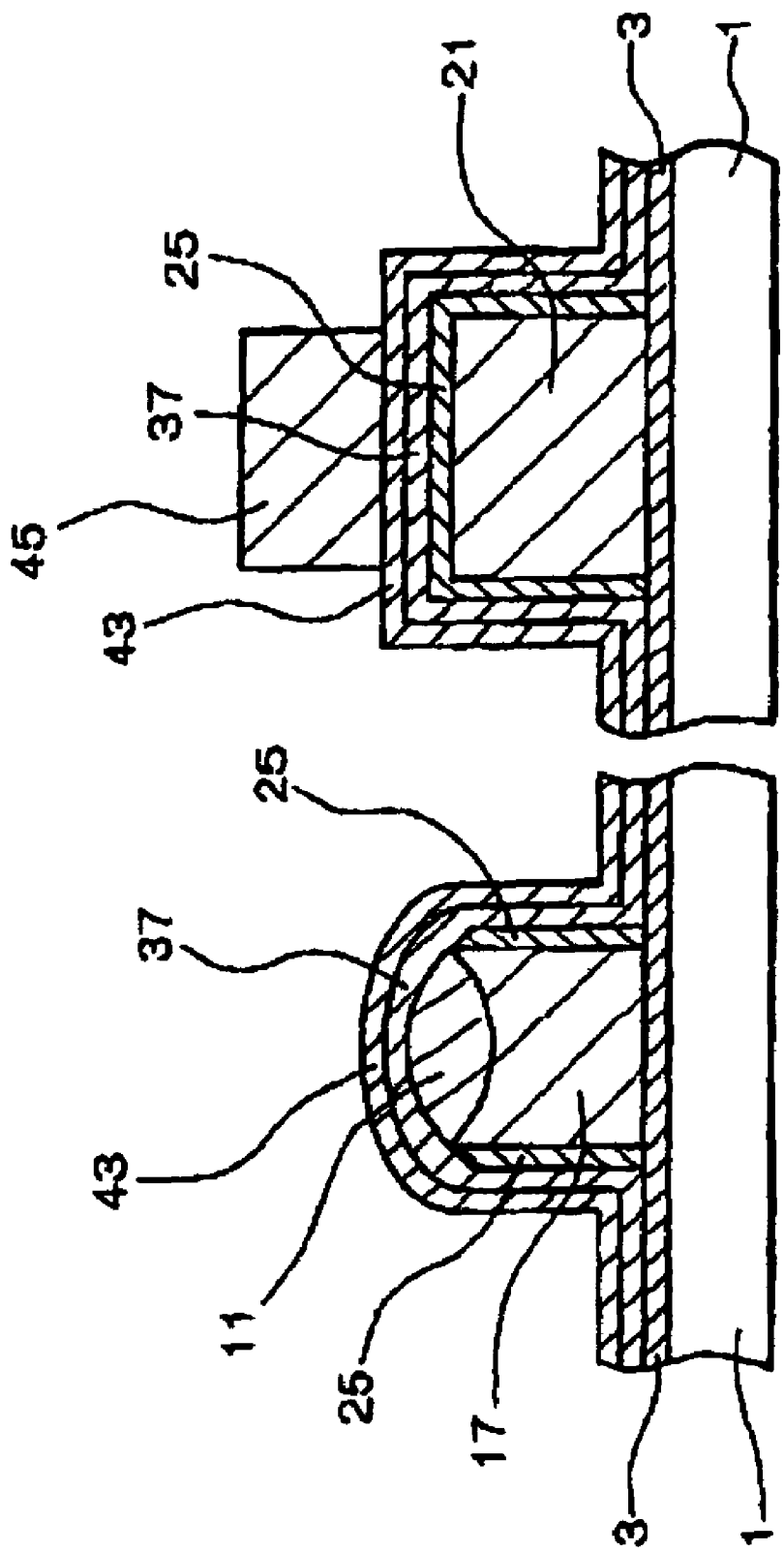
FIG. 20 is a cross-sectional view of the silicon substrate in a seventh step of a method for manufacturing a semiconductor device in accordance with the fourth embodiment of the present invention.

As shown in FIG. 20, a photoresist film is coated on the silicon nitride film 43, and the photoresist film is exposed to light and developed. As a result, a resist pattern 45 is formed on the lower electrode 21.

As shown in FIG. 21, the silicon nitride film 43 is anisotropically etched in a vertical direction, using the resist pattern 45 as a mask. As a result, side section insulation films 43a are formed in a lower section of the sidewall of the floating gate 17, and a silicon nitride film 43b is formed on the lower electrode 21.

Then, as shown in FIG. 22, a silicon oxide film 57 is deposited to a thickness of bout 60–80 angstrom over the entire surface including the side section insulation films 43a of the silicon nitride film, the silicon nitride film 43b and the silicon oxide film 37 by, for example, a thermal oxidation method.

Then, by using a method similar to the method of the first embodiment, a control gate 33 and an upper electrode 35 of the capacitor element are formed. Then, an impurity is introduced in the silicon substrate 1 on both sides of the control gate 33 and the floating gate 17, to thereby form diffusion regions (not shown) for source and drain regions in the silicon substrate 1.

The major effects of the fourth embodiment will be described. As shown in FIG. 22, in accordance with the fourth embodiment, the capacitor element 55 is formed from the lower electrode 21, the ONO film as a dielectric film (including the silicon oxide film 25, the silicon oxide film 37, the silicon nitride film 43b and the silicon oxide film 57) and the upper electrode 35. In this manner, in accordance with the fourth embodiment, split-gate type flash cells and capacitor elements can be readily mixed and mounted on the same silicon substrate 1. As a result, the number of chips can be reduced, compared to a conventional apparatus in which these device elements are formed on independent chips. Consequently, the product cost can be reduced.

In accordance with the first embodiment through the fourth embodiment, the capacitor value can be controlled by changing the impurity concentration of the lower electrode. For the explanation, a capacitor element sample A and a capacitor element sample B are prepared.

{Sample A}

Sample A is a capacitor element that is formed as follows:

(1) A lower electrode of polycrystal silicon film having a thickness of 1200 angstrom is formed. The lower electrode has an upper surface that is square with each of the edges being 3200 angstrom.

(2) Phosphorous is ion-implanted in the lower electrode with an acceleration voltage of 35 KeV.

(3) After the ion-implantation, the lower electrode is thermally oxidized at 750° C., to thereby form a thermal silicon oxide film on the lower electrode.

(4) A silicon nitride film having a thickness of 150 angstrom is formed on the thermal silicon oxide film.

(5) A thermal silicon oxide film is formed on the silicon nitride film by thermally oxidizing the silicon nitride film at 750° C.

(6) An upper electrode of polycrystal silicon having a thickness of 2500 angstrom is formed on the thermal silicon oxide film.

In the step (2) above, the impurity implantation is conducted with three different amounts (doses), i.e., $4.5 \times 10^{15}/cm^2$, $6 \times 10^{15}/cm^2$, and $8 \times 10^{15}/cm^2$.

{Sample B}

Sample B is a capacitor element that is formed as follows:

(1) A lower electrode of polycrystal silicon having a thickness of 1700 angstrom is formed. The lower electrode has an upper surface that is squire with each of the edges being 3200 angstrom.

(2) Phosphorous is ion-implanted in the lower electrode with an acceleration voltage of 35 KeV.

(3) After the ion-implantation, the lower electrode is thermally oxidized at 1000° C., to thereby form a thermal silicon oxide film on the lower electrode.

(4) A silicon nitride film having a thickness of 150 angstrom is formed on the thermal silicon oxide film.

(5) A thermal silicon oxide film is formed on the silicon nitride film by thermally oxidizing the silicon nitride film at 750° C.

(6) An upper electrode of polycrystal silicon having a thickness of 2500 angstrom is formed on the thermal silicon oxide film.

In the step (2) above, the impurity implantation is conducted with three different amounts (doses), i.e., $4.5 \times 10^{15}/cm^2$, $6 \times 10^{15}/cm^2$, and $8 \times 10^{15}/cm^2$.

Figure 23:
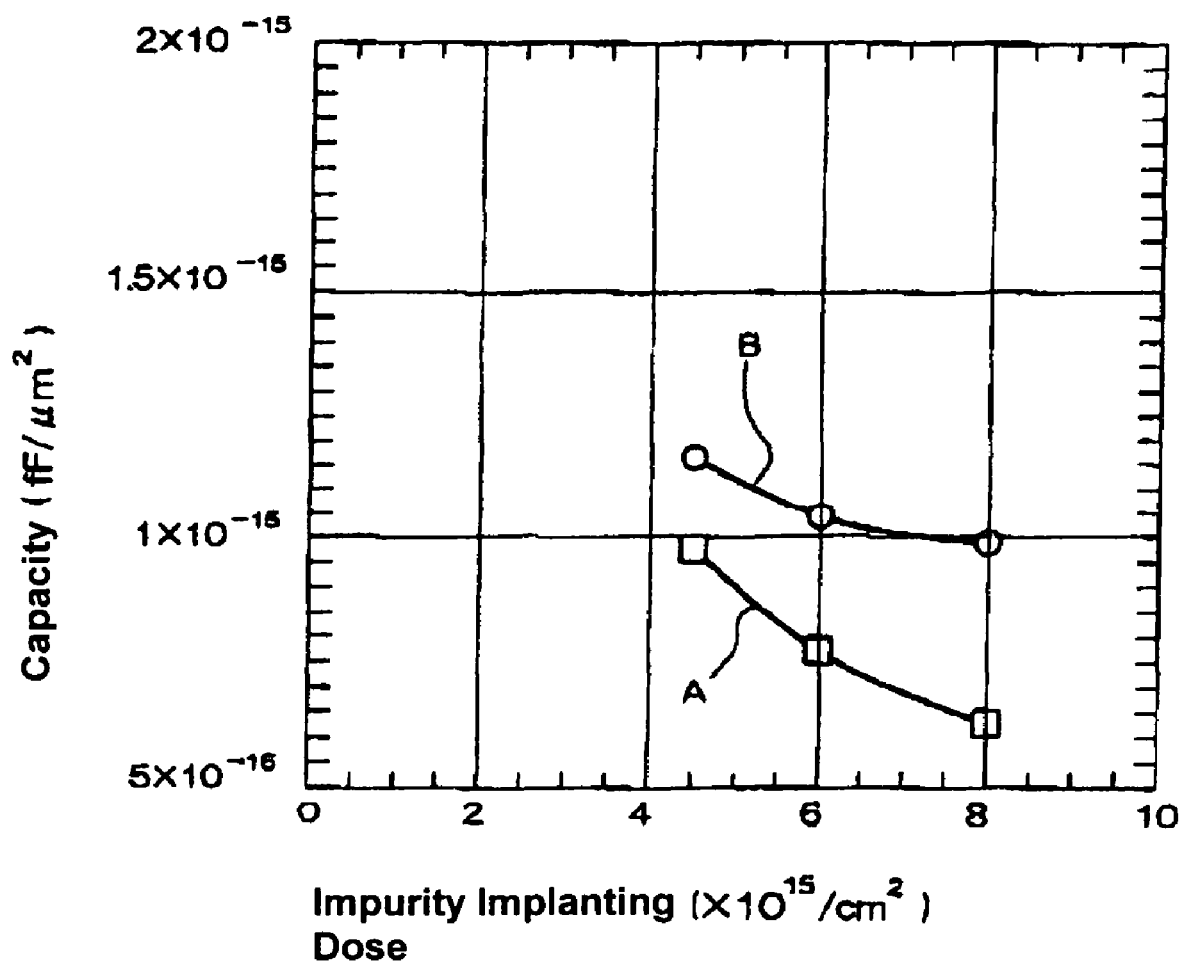
FIG. 23 is a graph showing the relation between the impurity implantation amount that is introduced in a lower electrode and the capacity value.

FIG. 23 shows a graph showing the relation between the implanting amount (dose) of the impurity that is introduced in the lower electrode and the capacitor value. In both of the cases of Sample A and Sample B, as the implanting amount of the impurity that is introduced in the lower electrode increases (in other words, as the impurity concentration in the lower electrode becomes higher), the capacitor value reduces. Also, in both of the cases of Sample A and Sample B, as the implanting amount of the impurity that is introduced in the lower electrode decreases (in other words, as the impurity concentration in the lower electrode becomes lower), the capacitor value increases. It is understood from the above that the capacitor value can be controlled by changing the impurity concentration in the lower electrode. Accordingly, the application of the characteristic described above to the first embodiment through the fourth embodiment, a capacitor element can be provided with a wider range of different capacitor values.

Also, in the first embodiment through the fourth embodiment, the control gate 33 and the upper electrodes 35 and 36 are formed from polycrystal silicon. However, the control gate 33 and the upper electrodes 35 and 36 can be formed from a polycide film having a two-layered structure that includes a silicide (such as, for example, titanium silicide, tungsten silicide, cobalt silicide and the like) and a polycrystal silicon. Also, the control gate 33 and the upper electrodes 35 and 36 can be formed from, for example, a metal, such as, for example, tungsten and aluminum. The control gate 33 and the upper electrodes 35 and 36 can be formed from a salicide. As a result, the resistance value of the control gate 33 and the upper electrodes 35 and 36 can be lowered, and a higher operation speed can be achieved.

Figure 24:
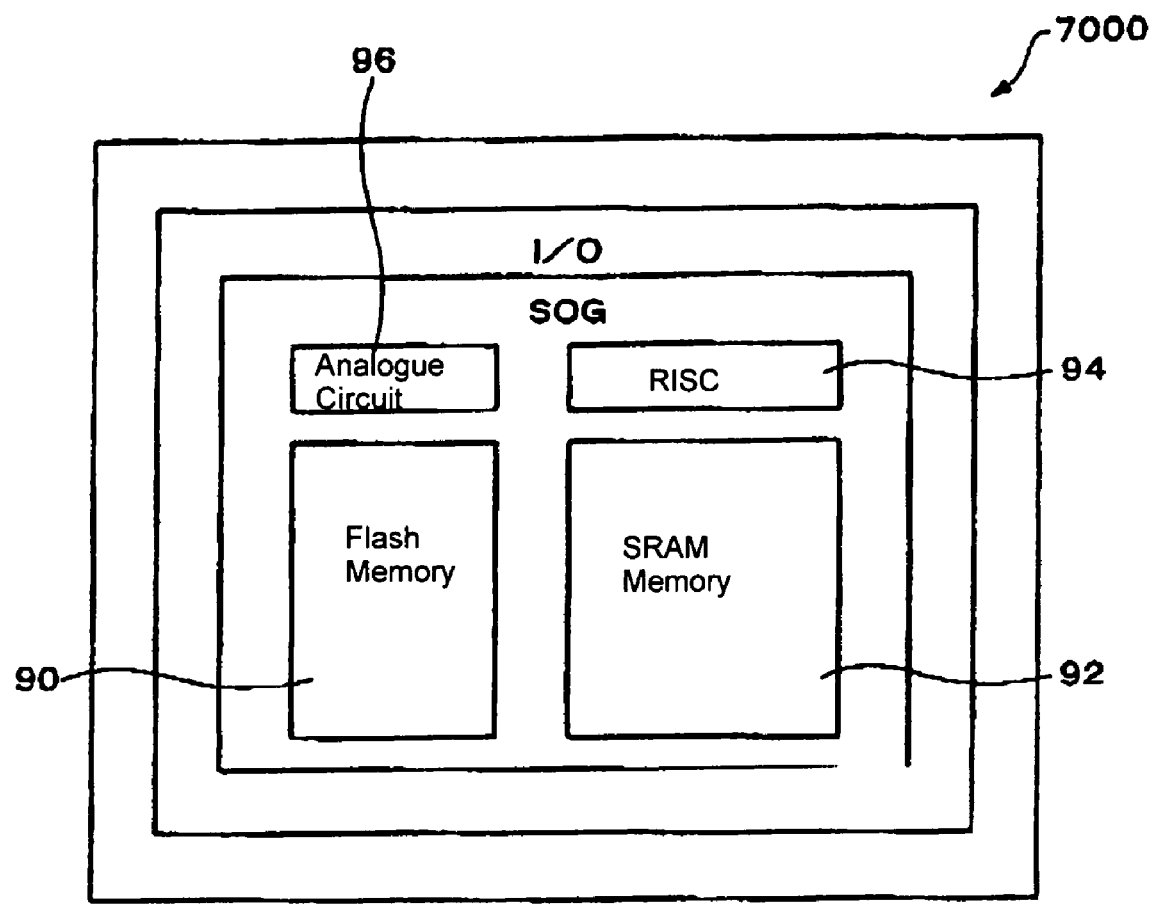
FIG. 24 is a schematic illustration of an embedded semiconductor device 7000 to which a semiconductor device of the first embodiment through the fourth embodiment is applied.

Also, FIG. 24 is a schematic layout of an embedded semiconductor device 7000 to which a semiconductor device of any one of the first embodiment through the fourth embodiment is applied. In this example, the embedded semiconductor device 7000 is mounted with a mixture of a flash memory 90, an SRAM memory 92, a RISC 94 and an analogue circuit 96 in an SOG (Sea of Gates). The split-gate type memory transistor 51 in accordance with the first embodiment through the fourth embodiment is a component of the flash memory 90. The capacitor elements 53 and 55 in accordance with the first embodiment through the fourth embodiment are components of the analogue circuit 96.

What is claimed is:

1. A semiconductor device having a non-volatile memory transistor, comprising:
   a first capacitor element and a second capacitor element, the non-volatile memory transistor, the first and the second capacitor element being formed in one semiconductor substrate, the first capacitor element including a first lower electrode, a first dielectric film and a first upper electrode, the second capacitor element having a second lower electrode, a second dielectric film and a second upper electrode, and the second dielectric film having a film thickness that is different from a film thickness of the first dielectric film, wherein the first dielectric film has a structure including a thermal oxidation film, a nitride film and an oxide film successively laid in a direction from the first lower electrode toward the first upper electrode, and wherein the second dielectric film has a structure including a first thermal oxide film, a CVD oxide film, a second thermal oxide film, a nitride film and an oxide film successively laid in a direction from the second lower electrode toward the second upper electrode.

2. A semiconductor device having a non-volatile memory transistor, comprising:

a first capacitor element and a second capacitor element, the non-volatile memory transistor, the first and the second capacitor element being formed in one semiconductor substrate, the first capacitor element including a first lower electrode, a first dielectric film having a plurality of films as components and a first upper electrode, the second capacitor element having a second lower electrode, a second dielectric film having a plurality of films as components and a second upper electrode, wherein the number of films as components of the second dielectric film of the second capacitor element is at least greater than the number of films as components of the first dielectric film of the first capacitor element, and the components of the second dielectric film being different from the components of the first dielectric films.

3. A semiconductor device according to claim 1 or claim 2, wherein the first and the second dielectric film include an ONO film.

4. A semiconductor device according to claim 2, wherein the first dielectric film has a structure including only a thermal oxidation film, a nitride film and an oxide film successively laid in a direction from the first lower electrode toward the first upper electrode, and the second dielectric film has a structure including only a first thermal oxide film, a CVD oxide film, a second thermal oxide film, a nitride film and an oxide film successively laid in a direction from the second lower electrode toward the second upper electrode.

5. A semiconductor device according to claim 1, wherein the thermal oxide film of the first dielectric film and the second thermal oxide film of the second dielectric film are formed in the same step, the nitride film of the first dielectric film and the nitride film of the second dielectric film are formed in the same step, and the oxide film of the first dielectric film and the oxide film of the second dielectric film are formed in the same step.

6. A semiconductor device according to claim 1, wherein the CVD oxide film of the second dielectric film includes a high-temperature CVD oxide film.

7. A semiconductor device according to claim 1, wherein each of the oxide film of the first dielectric film and the oxide film of the second dielectric film includes a thermal oxide film.

8. A semiconductor device according to claim 7, wherein the thermal oxide film of the first dielectric film has a thickness grown by a method that grows a thermal oxide film on silicon to a thickness of 30–200 angstrom, the nitride film of the first dielectric film has a thickness of 50–500 angstrom, the oxide film of the first dielectric film has a thickness grown by a method that grows a thermal oxide film on silicon to a thickness of 60–80 angstrom, the first thermal oxide film of the second dielectric film has a thickness grown by a method that grows a thermal oxide film on silicon to a thickness of 60–80 angstrom, the CVD oxide film of the second dielectric film has a thickness of 100–200 angstrom, the second thermal oxide film of the second dielectric film has a thickness grown by a method that grows a thermal oxide film on silicon to a thickness of 30–200 angstrom, the nitride film of the second dielectric film has a thickness of 50–500 angstrom, and the oxide film of the second dielectric film has a thickness grown by a method that grows a thermal oxide film on silicon to a thickness of 60–80 angstrom.

9. A semiconductor device according to claim 1, wherein each of the oxide film of the first dielectric film and the oxide film of the second dielectric film includes a CVD oxide film.

10. A semiconductor device according to claim 9, wherein the thermal oxide film of the first dielectric film has a thickness grown by a method that grows a thermal oxide film on silicon to a thickness of 30–200 angstrom, the nitride film of the first dielectric film has a thickness of 50–500 angstrom, the oxide film of the first dielectric film has a thickness of 100–200 angstrom, the first thermal oxide film of the second dielectric film has a thickness grown by a method that grows a thermal oxide film on silicon to a thickness of 60–80 angstrom, the CVD oxide film of the second dielectric film has a thickness of 100–200 angstrom, the second thermal oxide film of the another dielectric film has a thickness grown by a method that grows a thermal oxide film on silicon to a thickness of 30–200 angstrom, the nitride film of the second dielectric film has a thickness of 50–500 angstrom, and the oxide film of the second dielectric film has a thickness of 100–200 angstrom.

11. A semiconductor device according to claim 1 or claim 2, wherein the first and the second upper electrode are formed from polysilicon.

12. A semiconductor device having a non-volatile memory transistor, comprising:

a first capacitor element and a second capacitor element, the non-volatile memory transistor, the first and the second capacitor element being formed in one semiconductor substrate, the first capacitor element including a first lower electrode, a first dielectric film and a first upper electrode, the second capacitor element having a second lower electrode, a second dielectric film and a second upper electrode, and the second dielectric film having a film thickness that is different from a film thickness of the first dielectric film, wherein the first and the second upper electrodes are formed from polycide.

13. A semiconductor device having a non-volatile memory transistor, comprising:
   a first capacitor element and a second capacitor element,
   the non-volatile memory transistor, the first and the second capacitor element being formed in one semiconductor substrate,
   the first capacitor element including a first lower electrode, a first dielectric film and a first upper electrode,
   the second capacitor element having a second lower electrode, a second dielectric film and a second upper electrode, and
   the second dielectric film having a film thickness that is different from a film thickness of the first dielectric film,
   wherein the first and the second upper electrodes are formed from metal.

14. A semiconductor device having a non-volatile memory transistor, comprising:
   a first capacitor element and a second capacitor element,
   the non-volatile memory transistor, the first and the second capacitor element being formed in one semiconductor substrate,
   the first capacitor element including a first lower electrode, a first dielectric film having a plurality of films as components and a first upper electrode,
   the second capacitor element having a second lower electrode, a second dielectric film having a plurality of films as components and a second upper electrode, and
   the components of the second dielectric film being different from the components of the first dielectric films,
   wherein the first and the second upper electrodes are formed from salicide.

15. A semiconductor device according to claim 1 or claim 2, wherein the first and the second lower electrode are films that are formed in the same step, and the first and the second upper electrode are films that are formed in the same step.

16. A semiconductor device according to claim 1, wherein the non-volatile memory transistor includes
   a floating gate,
   a control gate, and
   an intermediate insulation film located between the floating gate and the control gate, wherein
   the intermediate insulation film has a structure having a first thermal oxide film, a CVD oxide film, a second thermal oxide film and an oxide film that are successively disposed in a direction from the floating gate toward the control gate.

17. A semiconductor device according to claim 16, wherein
   the first thermal oxide film of the intermediate insulation film and the first thermal oxide film of the second dielectric film are formed in the same step,
   the CVD oxide film of the intermediate insulation film and the CVD oxide film of the second dielectric film are formed in the same step,
   the second thermal oxide film of the intermediate insulation film, the thermal oxide film of the first dielectric film and the second thermal oxide film of the second dielectric film are formed in the same step, and
   the oxide film of the intermediate insulation film, the oxide film of the first dielectric film and the oxide film of the second dielectric film are formed in the same step.

18. A semiconductor device according to claim 16, wherein the intermediate insulation film includes a nitride film, wherein
   the nitride film of the intermediate insulation film is located below a sidewall of the floating gate and between the second thermal oxide film of the intermediate insulation film and the oxide film of the intermediate insulation film.

19. A semiconductor device according to claim 18, wherein the nitride film of the intermediate insulation film, the nitride film of the first dielectric film and the nitride film of the second dielectric film are formed in the same step.

20. A semiconductor device according to claim 16, wherein the CVD oxide film of the intermediate insulation film includes a high-temperature thermal CVD oxide film.

21. A semiconductor device according to claim 16, wherein the oxide film of the intermediate insulation film includes at least one of a thermal oxide film and a CVD oxide film.

22. A semiconductor device according to claim 16, wherein the control gate, the first and the second upper electrode are formed from polysilicon.

23. A semiconductor device according to claim 16, wherein the control gate, the first and the second upper electrode are formed from polycide.

24. A semiconductor device according to claim 16, wherein the control gate, the first and the second upper electrode are formed from metal.

25. A semiconductor device according to claim 16, wherein the control gate, the first and the second upper electrode are formed from salicide.

26. A semiconductor device according to claim 16, wherein the floating gate, the first and the second lower electrode are formed in the same step, and
   the control gate, the first and the second upper electrode are formed in the same step.

27. A semiconductor device according to claim 1 or claim 2, wherein an area of the first upper electrode that faces a surface of the first dielectric film is the same as an area of the second upper electrode that faces a surface of the second dielectric film.

28. A semiconductor device according to claim 1 or claim 2, wherein an area of the first upper electrode that faces a surface of the first dielectric film is different from an area of the second upper electrode that faces a surface of the second dielectric film.

29. A semiconductor device having a non-volatile memory transistor, comprising:
   a first capacitor element and a second capacitor element,
   the non-volatile memory transistor, the first and the second capacitor element being formed in one semiconductor substrate,
   the first capacitor element including a first lower electrode, a first dielectric film and a first upper electrode,
   the second capacitor element having a second lower electrode, a second dielectric film and a second upper electrode, and
   the second dielectric film having a film thickness that is different from a film thickness of the first dielectric film, wherein the second lower electrode has an impurity concentration different from an impurity concentration of the first lower electrode.

30. A semiconductor device having a non-volatile memory transistor, comprising:
   a first capacitor element and a second capacitor element,
   the non-volatile memory transistor, the first and the second capacitor element being formed in one semiconductor substrate,
   the first capacitor element including a first lower electrode, a first dielectric film having a plurality of films as components and a first upper electrode,
   the second capacitor element having a second lower electrode, a second dielectric film having a plurality of films as components and a second upper electrode, and
   the components of the second dielectric film being different from the components of the first dielectric films, wherein the first dielectric film has a film thickness of 180–900 angstrom, and the second dielectric film has a film thickness of 340–1180 angstrom.

31. A semiconductor device according to claim 1 or claim 2, wherein the first capacitor element has a capacitor value that is different from a capacitor value of the second capacitor element.

32. A semiconductor device according to claim 1 or claim 2, wherein each of the first and the second capacitor element is a component of an analogue circuit.

33. A semiconductor device according to claim 1 or claim 2, wherein the non-volatile memory transistor includes a split-gate type non-volatile memory transistor.

* * * * *